United States Patent
Kato et al.

(10) Patent No.: US 8,241,457 B2
(45) Date of Patent: Aug. 14, 2012

(54) PLASMA PROCESSING SYSTEM, PLASMA MEASUREMENT SYSTEM, PLASMA MEASUREMENT METHOD, AND PLASMA CONTROL SYSTEM

(75) Inventors: Mitsuo Kato, Kanagawa (JP); Masaki Sugiyama, Kanagawa (JP); Akihiko Hiroe, Miyagi (JP); Tadahiro Ohmi, Miyagi (JP); Masaki Hirayama, Miyagi (JP)

(73) Assignees: Tokyo Electron Limited, Tokyo (JP); Tohoku University, Sendai-shi (JP)

( * ) Notice: Subject to any disclaimer, the term of this patent is extended or adjusted under 35 U.S.C. 154(b) by 1093 days.

(21) Appl. No.: 12/058,323

(22) Filed: Mar. 28, 2008

(65) Prior Publication Data
US 2008/0241016 A1    Oct. 2, 2008

(30) Foreign Application Priority Data

Mar. 30, 2007 (JP) ................ 2007-094965
Mar. 26, 2008 (JP) ................ 2008-079584

(51) Int. Cl.
  *H01L 21/00* (2006.01)
  *C23C 16/00* (2006.01)
  *C23C 14/00* (2006.01)

(52) U.S. Cl. ......... 156/345.28; 156/345.51; 156/345.47; 156/345.41; 118/723 R; 118/723 MW

(58) Field of Classification Search ............ 156/345.24, 156/345.43, 345.47, 345.28, 345.51, 345.41; 118/723 R, 723 MW
See application file for complete search history.

(56) References Cited

U.S. PATENT DOCUMENTS 5,472,561 A * 12/1995 Williams et al. ............... 438/10
6,201,208 B1 * 3/2001 Wendt et al. ............. 219/121.41
2006/0249729 A1 * 11/2006 Mundt et al. .................... 257/48

FOREIGN PATENT DOCUMENTS

| JP | 11-064287 | 3/1999 |
| JP | 2003-124201 | 5/2003 |
| JP | 2005-116818 | 4/2005 |
| JP | 2007-281205 | 10/2007 |

OTHER PUBLICATIONS

Office Action in Japanese Patent Application No. 2008-079584 dated Mar. 27, 2012 with English translation.

* cited by examiner

*Primary Examiner* — Ram N. Kackar
(74) *Attorney, Agent, or Firm* — Oblon, Spivak, McClelland, Maier & Neustadt, L.L.P.

(57) ABSTRACT

A microwave plasma processing system 10 includes: a processing chamber 100 in which a desired process is applied to a target object using a plasma; a susceptor 106 (stage) in the processing chamber 100 to support the target object; a high-frequency power supply 112 supplying high-frequency electric power to the susceptor 106; a capacitor 108a provided to the susceptor 106; and a measurement device 20 measuring voltages at the pair of plates of the capacitor 108a when high-frequency electric power is supplied from the high-frequency power supply 112 to the susceptor 106.

14 Claims, 15 Drawing Sheets

FIG.7

| $P\mu(W)/P_{rf}(W)$ | | $V_1$ | $V_2$ | $V_3$ | $V_4$ | volt,arg($V_2/V_1$) | volt,arg($V_3/V_2$) | volt,arg($V_4/V_3$) |
|---|---|---|---|---|---|---|---|---|
| 3000/100 | (V) | 48.31 | 61.86 | 76.60 | 91.72 | 1.280 | 1.238 | 1.197 |
| | (rad) | −1.55 | −1.67 | −1.75 | −1.80 | −0.116 | −0.086 | −0.050 |
| 3000/500 | (V) | 146.91 | 167.42 | 188.36 | 210.26 | 1.140 | 1.125 | 1.116 |
| | (rad) | −1.17 | −1.22 | −1.24 | −1.28 | −0.049 | −0.022 | −0.031 |
| 5500/100 | (V) | 16.03 | 33.20 | 53.66 | 74.80 | 2.071 | 1.616 | 1.394 |
| | (rad) | −1.61 | −2.15 | −2.30 | −2.37 | −0.537 | −0.153 | −0.068 |
| 5500/500 | (V) | 62.67 | 88.96 | 118.92 | 149.81 | 1.420 | 1.337 | 1.260 |
| | (rad) | −1.32 | −1.53 | −1.64 | −1.71 | −0.211 | −0.108 | −0.068 |

FIG.8

| $P_\mu(W)/P_{rf}(W)$ | | $I_{21}$ | $I_{32}$ | $I_{43}$ | $P_{21}(W)$ | $P_{32}(W)$ | $P_{43}(W)$ |
|---|---|---|---|---|---|---|---|
| 3000/100 | (V) | 5.72 | 6.10 | 5.92 | 66.23 | 76.16 | 68.53 |
|  | (deg) | -15.92 | -19.56 | -15.33 | | | |
| 3000/500 | (V) | 8.37 | 8.18 | 8.60 | 229.45 | 144.94 | 225.72 |
|  | (deg) | 11.54 | 18.49 | 12.88 | | | |
| 5500/100 | (V) | 8.07 | 8.24 | 8.14 | 52.08 | 52.82 | 52.17 |
|  | (deg) | -41.83 | -42.73 | -42.01 | | | |
| 5500/500 | (V) | 11.72 | 12.28 | 12.15 | 222.91 | 224.76 | 227.42 |
|  | (deg) | -19.20 | -21.46 | -19.69 | | | |

PLASMA PROCESSING SYSTEM, PLASMA MEASUREMENT SYSTEM, PLASMA MEASUREMENT METHOD, AND PLASMA CONTROL SYSTEM

CROSS-REFERENCE TO RELATED APPLICATION

The present invention contains subject matter related to Japanese Patent Application JP2007-094965, filed in the Japan Patent Office on Mar. 30, 2007, and Japanese Patent Application JP2008-079584, filed in the Japan Patent Office on Mar. 26, 2008, and the entire contents of which being incorporated herein by reference.

BACKGROUND OF THE INVENTION

1. Field of the Invention

The present invention relates to a plasma processing system that is able to measure a parameter for plasma control, a system and a method for measuring a parameter for plasma control, and a system for controlling a plasma processing system that is able to measure a parameter for plasma control.

2. Description of the Related Art

FIG. 15 shows a generally known plasma processing system 1000. The system 1000 includes a processing chamber U in which gases are ionized into a plasma. The plasma is used to apply a substrate G with a plasma process such as an etching or a sputtering. The plasma processing system 1000 includes a processing chamber 1005 in which the plasma process is performed. The chamber 1005 contains a susceptor 1010 on which the substrate G is mounted. The susceptor 1010 has an electrode 1015 embedded therein. The electrode 1015 connects to a high-frequency power supply 1020. The high-frequency power supply 1020 outputs high-frequency electric power, which applies a predetermined bias voltage in the processing chamber U. The bias voltage can increase the energy by which charged particles included in the plasma collide with the substrate G.

A matching box 1025 resides between the electrode 1015 and the high-frequency power supply 1020. The matching box 1025 includes a variable series capacitor $C_1$ connected in series with an electrode 1015 via a power-supply line 1030a, a variable parallel capacitor $C_2$ connected between a power-supply line 1030b and ground, and an inductor L. The matching box 1025 has a function of apparently matching the output impedance of the high-frequency power supply 1020 and load impedance that couples the load of the matching box 1025 and the internal load of the processing chamber 1005. The impedance matching can protect the high-frequency power supply 1020 and increase the use efficiency of the high-frequency electric power from the high-frequency power supply 1020.

The microwave plasma processing system 1000 has, however, capacitance Cs (parasitic capacitance) between the processing chamber 1005 and the susceptor 1010 or between the processing chamber 1005 and a power feeding rod 1010a supporting the susceptor 1010. At the high frequency, inductance L exists across which a significant voltage drop occurs in a power-supply line 1030a. The impedance thus generated downstream of the matching box 1025 (the high-frequency power supply 1020 is upstream of the box 1025) causes a significant portion of the high-frequency electric power from the high-frequency power supply 1020 to be consumed as the electric power is transmitted the power-supply line 1030a. Specifically, as the impedance downstream of the matching box 1025 increases, the high-frequency electric power available for the plasma control decreases.

Additionally, the conditions of the capacitive and inductive components generated downstream of the matching box 1025 depends on the dimension and material of the microwave plasma processing system 1000 or the like. The conditions also vary with the amount and type of the deposit formed on the wall surfaces of the processing chamber 1005 and the susceptor 1010 or the like. In this way, unpredictable change occurs in the impedance downstream of the matching box 1025. As the high-frequency signal is transmitted downstream of the matching box 1025, therefore, the high-frequency electric power experiences unpredictable loss.

To address the above issues, a feedback control system SS is proposed as follows (see, for example, JP 2005-116818). The system SS includes a measurement device 1035 and a control circuit 1040. The measurement device 1035 connects to the power-supply line 1030a between the matching box 1025 and the electrode 1015. The measurement device 1035 measures, for example, a voltage and power applied to the measurement position P. The control circuit 1040A compares the measured parameter and a desired target value. The comparison is used to feedback control the high-frequency power supply 1020.

SUMMARY OF THE INVENTION

The high-frequency electric power is consumed, however, as the high-frequency signal is transmitted from the measurement position P to a position immediately below the substrate, as described above. The consumption is due to the capacitance Cs, the capacitance Cs being generated around the susceptor 1010 and the power feeding rod 1010a, and the inductance L generated in the power-supply line 1030. A significant power difference thus occurs between the actual measurement of the high-frequency signal transmitted the measurement position P and the high-frequency electric power immediately below the substrate. Additionally, the power difference varies with the change of the capacitive component Cs and the inductive component L as described above. Actually, when the maintenance (cleaning) or the like changes the condition of the deposit formed on the processing chamber 1005 or the process state, the capacitive component Cs and the inductive component L largely change accordingly. This changes the portion of the high-frequency electric power that is lost as the high-frequency signal transmitted from the measurement position P to the electrode 1015.

In this way, the loss of the high-frequency electric power during the transmission of the high-frequency signal is relatively large and changes over time depending on the condition of the processing chamber. The loss thus includes an unpredictable portion. From these reasons, in the above measurement method that measures the voltage and the power at the measurement position P apart from the substrate, it is difficult to accurately understand the state of the high-frequency electric power immediately below the substrate. It may be difficult for the above measurement method to control the plasma process accurately or to perform the plasma process more stably. In every maintenance, therefore, one should manually reset the process conditions including the high-frequency electric power from the high-frequency power supply 1020 according to the previous experiences. This procedure is rather complicated.

Such a large loss or variation of the high-frequency electric power during the transmission of the high-frequency signal may unexpectedly change the process speed. To control the plasma accurately and perform the process more stably, it is thus desirable to directly measure the high-frequency electric power immediately below the substrate, the electric power being available for the plasma control.

An embodiment of the present invention is a plasma processing system that is able to measure high-frequency electric power in the vicinity of a substrate using a capacitor, a system and a method for measuring the high-frequency electric power in the vicinity of a substrate using a capacitor, and a control system for controlling a plasma processing system by measuring the high-frequency electric power in the vicinity of a substrate using a capacitor.

Specifically, an embodiment of the present invention is a plasma processing system including: a processing chamber in which a desired process is applied to a target object using a plasma; a stage on which the target object is disposed in the processing chamber; a high-frequency power supply supplying high-frequency electric power to the stage; a capacitor provided to the stage; and a measurement device measuring voltages at a pair of plates of the capacitor when the high-frequency electric power is supplied from the high-frequency power supply to the stage.

Suppose now that the sheath capacitance $C_{sheath}$ is the ground sheath capacitance $C_2$ and a ratio of the ground sheath capacitance $C_2$ to an electrode sheath capacitance $C_1$ of the capacitor is $\psi$. The capacitor capacitance C may then be determined to allow the value of $1+\psi \times C_{sheath}^2/\{(1+\psi) \times C_{sheath} \times C\}$ to be equal to or more than a electrode-voltage ratio that provides within a margin of error among those ratios measured using the capacitor. The capacitor capacitance C may be 4.2 times or less than the ground sheath capacitance $C_{sheath}$.

Actual measurements by the applicants have shown that the measurement errors increase for a predetermined electrode voltage amplitude ratio of less than about 1.2, in other words, the measurement accuracy degrades for the voltage-amplitude ratio of less than about 1.2. Applying these experimental results to the expression (9) described below "$1+\psi \times C_{sheath}^2/\{(1+\psi) \times C_{sheath} \times C\}$>=voltage-amplitude ratio," it may be shown that a capacitor having a capacitance of 4.2 times or less than the sheath capacitance may be provided in the vicinity of the power feeding portion in the processing chamber of the plasma processing system to reduce the measurement errors to acceptable levels. Specifically, the measurement errors in measuring the voltages $V_1$ and $V_2$ at the pair of plates of the capacitor may be acceptable.

Each of the voltages $V_1$ and $V_2$ is then split into frequency components, i.e., harmonic components with the power-supply frequency being the fundamental wave. The coefficients are determined by the least squares method. The amplitude $M_k$ and the phase difference $\phi_k$ at each frequency are calculated (refer to the expressions (1) to (3) as described below). From the effective values of the amplitudes and the power factors ($\cos(\phi_{Ik}-\phi_{Vlk})$), $M_{Ik}$ and $MV_{Ik}$, the power P applied to the capacitor is directly determined by the following expression (1).

$$P = \sum_k \frac{M_{Ik} \times M_{Vlk}}{2} \times \cos(\varphi_{Ik} - \varphi_{Vlk}) \quad [\text{eq. 1}]$$

k = the degree of the harmonic

In this way, the actual measurements of the voltages $V_1$ and $V_2$ at the pair of plates of the capacitor may be used to directly measure the power P applied to the capacitor, i.e., the power P approximately equal to the power immediately below the substrate. The measurement errors included in the power P computed from the above expression may be made sufficiently small by setting the capacitor capacitance to 4.2 times (preferably 2.1 times) or less than the sheath capacitance. The measurement errors will be described in more detail below.

An example where the capacitor capacitance is set to 4.2 times or less than the sheath capacitance by providing the capacitor partially or entirely in the power feeding portion at a position opposing the target object supported by the stage.

Another example where The capacitor capacitance is set to 4.2 times or less than the sheath capacitance by providing the capacitor partially in the power feeding portion at a position not opposing the target object supported by the stage.

The capacitor may also be provided partially in the power-feeding portion at an end thereof.

The capacitor capacitance may also be set to 4.2 times or less than the sheath capacitance by having a dielectric material of a predetermined dielectric constant between the capacitor's electrodes or having a predetermined electrode area and a predetermined electrode interval.

A resonance circuit connected in series to the capacitor may also be provided.

The load-impedance increase due to the capacitor may thus be cancelled using the resonance circuit connected in series to the capacitor. Reducing the impedance on the power-supply line to decrease the loss of the high-frequency electric power may additionally increase the amount of the high-frequency electric power available for the plasma control.

The plasma processing system may also include a stage in the processing chamber to support the target object, the power feeding portion may be provided in the stage, the capacitor may be provided partially or entirely in the power feeding portion at a position opposing the target object supported by the stage, and the capacitor may be formed in the stage. The capacitor may provide the particle source. The capacitor may thus be embedded in the stage to keep the interior of the processing chamber clean.

Additionally, another embodiment of the present invention is a measurement system used for a plasma processing system, the plasma processing system including: a processing chamber in which a desired process is applied to a target object using a plasma; a stage on which the target object is disposed in the processing chamber; a high-frequency power supply supplying high-frequency electric power to the stage; and a capacitor provided to the stage, the measurement system measuring voltages at a pair of plates of the capacitor when the high-frequency electric power is supplied from the high-frequency power supply to the stage.

Suppose now that the sheath capacitance $C_{sheath}$ is the ground sheath capacitance $C_2$ and a ratio of the ground sheath capacitance $C_2$ to an electrode sheath capacitance $C_1$ of the capacitor is $\psi$. The capacitor capacitance C may then be determined to allow the value of $1+\psi \times C_{sheath}^2/\{(1+\psi) \times C_{sheath} \times C\}$ to be equal to or more than a electrode-voltage ratio that provides within a margin of error among those ratios measured using the capacitor. The capacitor capacitance C may be 4.2 times or less than the ground sheath capacitance $C_{sheath}$.

Additionally, another embodiment of the present invention is a measurement method used for a plasma processing system, the system including: a processing chamber in which a desired process is applied to a target object using a plasma; a stage on which the target object is disposed in the processing chamber; a high-frequency power supply supplying high-frequency electric power to the stage; and a capacitor provided to the stage, the measurement method measuring voltages at a pair of plates of the capacitor when the high-frequency electric power is supplied from the high-frequency power supply to the stage.

Additionally, another embodiment of the present invention is a control system for controlling a plasma using a plasma processing system, the plasma processing system including: a processing chamber in which a desired process is applied to a target object using a plasma; a stage on which the target object is disposed in the processing chamber; a capacitor provided to the stage; a power feeding portion embedded in the stage; and a high-frequency power supply connected to the stage, the high-frequency power supply supplying high-frequency electric power to the stage, the control system measuring a parameter to control the plasma and controlling the plasma according to the measured parameter, the control system including: a measurement device measuring voltages at a pair of plates of the capacitor when the high-frequency electric power is supplied from the high-frequency power supply to the stage; and a control section using voltages at a pair of plates of the capacitor measured by the measurement device to compute the high-frequency electric power, the control section also using the computed high-frequency electric power to feedback control the high-frequency power supply.

To measure the parameter to control the plasma, the control section may use a capacitor having a capacitance C of 4.2 times or less than the sheath capacitance $C_{sheath}$. At least one of the voltage, the current, and the phase at each plate of the capacitor may be measured as the parameter to control the plasma. The measured parameters may then be used to compute the high-frequency electric power.

At least one of the above parameters may thus be used to accurately understand the power immediately below the substrate.

The plasma processing system may also include a high-frequency power supply connected to the power feeding portion, the power supply supplying high-frequency electric power to the power feeding portion, and also a matching box provided between and connected to the high-frequency power supply and the power feeding portion, the matching box matching the output impedance of the high-frequency power supply and the load impedance of the power feeding portion.

The matching box is thus provided between the high-frequency power supply and the power-feeding portion. Upstream of the matching box, the feedback control may optimize the high-frequency electric power from the high-frequency power supply, while downstream of the matching box, the matching box may match the load impedance that changes constantly with the output impedance of the high-frequency power supply. The loss of the high-frequency electric power from the high-frequency power supply may thus be minimized, thereby maximizing the use of the high-frequency electric power for the plasma control.

Thus, the present invention may measure the high-frequency electric power in the vicinity of the substrate using a capacitor.

BRIEF DESCRIPTION OF THE DRAWINGS

FIG. 7 shows measurement results of the electrode potential of each substrate;
FIG. 8 shows current waveforms and power calculated from the measured potentials.

DETAILED DESCRIPTION OF THE EMBODIMENTS

With reference to the accompanying drawings, one embodiments of the present invention will be described in more detail below. Note that, in the following discussion and accompanying drawings, the elements having the same configuration and function are provided with the same reference symbols and their description are omitted. Note also that in the present specification, 1 sccm is $(10^{-6}/60)$ m$^3$/sec and 1 mTorr is $(10^{-3} \times 101325/760)$ Pa at 0° C. and 1 atm.

Figure 1:
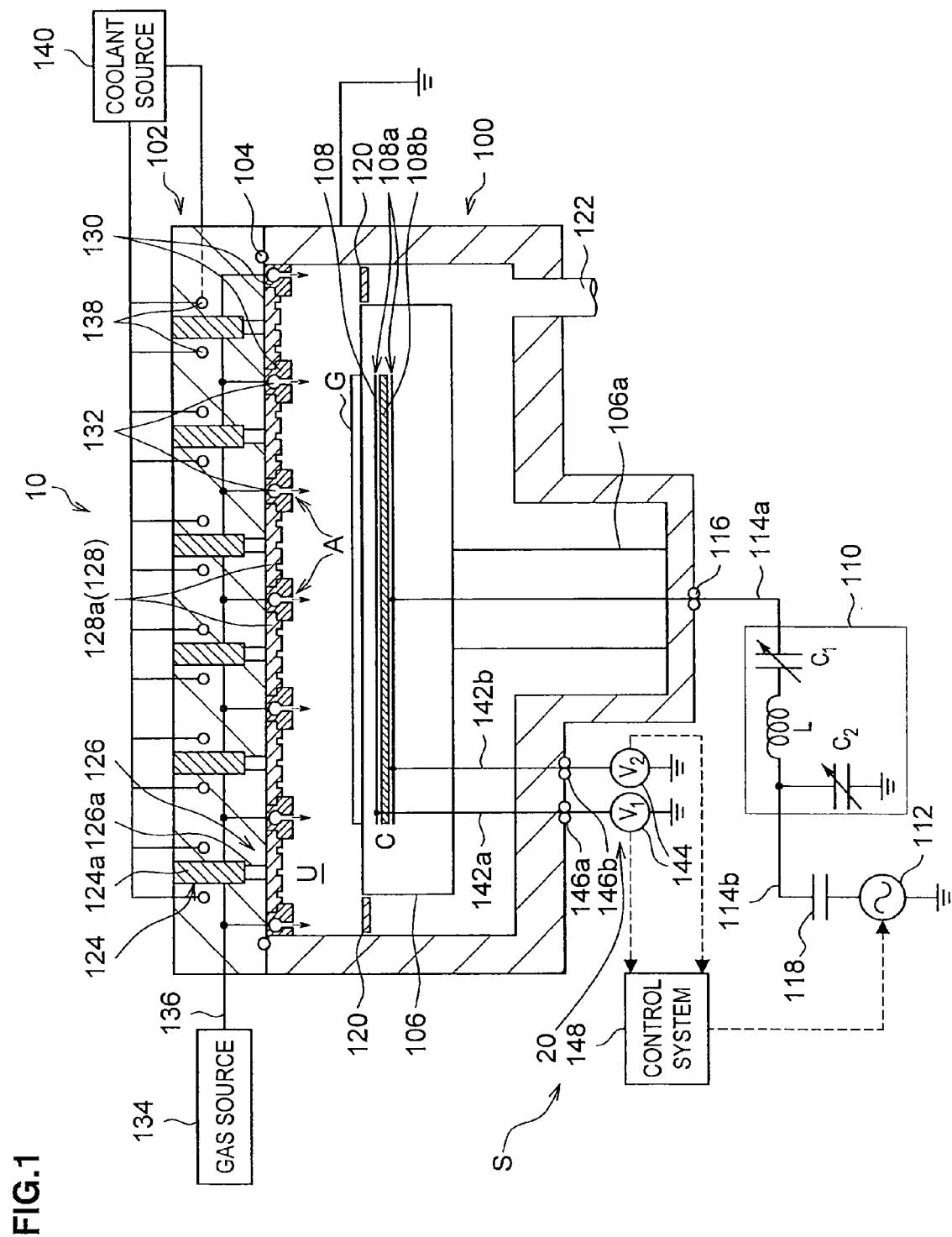
FIG. 1 is a configuration diagram of a measurement system including a microwave plasma processing system according to one embodiment of the present invention.

First, with reference to FIG. 1, a description is given of a configuration of a measurement system using a microwave plasma processing system according to one embodiment of the present invention.
(Measurement System)

A measurement system S includes a measurement device 20 and a control system 148. The measurement device 20 measures a voltage in the vicinity of the substrate as a parameter to control a plasma generated in a microwave plasma processing system 10. The control system 148 feedback controls a high-frequency power supply according to the voltage measured by the measurement device 20. The microwave plasma processing system 10, the measurement device 20, and the control system 148 will be described sequentially below. Note that the microwave plasma processing system is an example of a plasma processing system that applies a desired process to the target object using the plasma.
(Configuration of Microwave Plasma Processing System)

The microwave plasma processing system 10 in this embodiment includes a processing chamber 100 and a lid 102. The processing chamber 100 has a bottom-closed cube shape with an opening formed on the top thereof. The processing chamber 100 and the lid 102 are sealed by an O-ring 104 provided on a contact surface between the chamber 100 and the lid 102. A processing chamber U is thus formed in which a plasma process is applied. The processing chamber 100 and the lid 102 are made of, for example, metal such as aluminum. The chamber 100 and the lid 102 are electrically grounded.

The processing chamber 100 contains a susceptor 106 to support a glass substrate (hereinafter referred to as a "substrate") G. The susceptor 106 is made of, for example, nitride aluminum. The susceptor 106 contains a power-feeding portion 108. The susceptor 106 is supported by a power feeding rod 106a. A portion including the susceptor 106 and the power feeding rod 106a is hereinafter referred to as a stage.

The susceptor 106 contains the power-feeding portion 108. The power-feeding portion 108 is provided at a position opposing the substrate G. The portion 108 is provided as a capacitor 108a including two metal plates each having the same area as the substrate G. The capacitor 108a includes a dielectric material 108b sandwiched therein. The dielectric material 108b has a low dielectric constant and the same area as the metal plates. The capacitor 108a including the dielectric material 108b sandwiched therein has a capacitance of 4.2 times or less than the sheath capacitance.

Note that instead of sandwiching the dielectric material 108b with a low dielectric constant in the capacitor 108a, the distance between the two metal plates of the capacitor 108a may be increased to set the capacitance of the capacitor 108a to 4.2 times or less than the sheath capacitance. The reason the capacitance of the capacitor 108a is set to 4.2 times (preferably 2.1 times) or less than the sheath capacitance will be described below.

The power-feeding portion 108 is connected to a high-frequency power supply 112 via a matching box 110. The matching box 110 and the high-frequency power supply 112 reside outside the processing chamber 100. The high-frequency power supply 112 is grounded.

The 108 is adapted to apply a predetermined bias voltage to the interior of the processing chamber 100 using the high-frequency electric power from the high-frequency power supply 112. The power-feeding portion 108 is also adapted to electrostatically chuck the substrate G using a dc voltage from a not-shown high-voltage dc power supply.

The matching box 110 includes a variable series capacitor $C_1$ and a variable parallel capacitor $C_2$. The series capacitor $C_1$ is connected in series with the power feeding portion 108 via a power-supply line 114a. The parallel capacitor $C_2$ is connected between ground and the inductor L and a power-supply line 114b. The matching box 110 has a function of minimizing the loss of the high-frequency electric power during the transmission of the high-frequency signal by apparently matching the output impedance of the high-frequency power supply 112 and load impedance that couples the load of the matching box 110 and the internal load of the processing chamber 100. The power-supply line 114b passes through the bottom wall of the processing chamber 100. The bottom wall has an O-ring 116 attached thereto. The O-ring 116 seals the processing chamber. Note that a capacitor 118 is provided on the power-supply line 114b in the vicinity of the high-frequency power supply 112 to connect the high-frequency power supply 112 to the matching box 110 with as low an impedance as possible.

The susceptor 106 has a baffle plate 120 surrounding it. The baffle plate 120 controls the gas flow in the processing chamber U to provide a suitable flow. The processing chamber 100 has a vacuum pump (not shown) outside the bottom. The vacuum pump exhausts gases in the processing chamber 100 via a gas exhaust pipe 122. The processing chamber U is thus evacuated to a desired degree of vacuum.

The lid 102 includes six waveguides 124, a slot antenna 126, and a dielectric window 128 (including a plurality of dielectric parts 128a). Each of the six waveguides 124 has a rectangular cross section. They are arranged in parallel in the lid 102. The interior of each waveguide 124 is filled with a dielectric member 124a. The dielectric member 124a is made of, for example, fluorine resin (such as Teflon (registered trademark)), alumina ($Al_2O_3$), and quartz. The dielectric member 124a controls the guided wavelength $\lambda g_1$ of each waveguide 124 according to the expression of $\lambda g_1 = \lambda c/(\in_1)^{1/2}$. $\lambda c$ is a wavelength in a free space, $\in_1$ is a dielectric constant of the dielectric member 124a.

Each waveguide 124 has the slot antenna 126 at the bottom. The slot antenna 126 functions as an antenna. The slot antenna 126 has a slot (opening) 126a formed at the bottom surface of the waveguide 124. Note that an arbitrary number of slots 126a may be formed at the bottom surface of each waveguide 124.

The dielectric window 128 includes the dielectric parts 128a. Each dielectric part 128a is made of alumina. Note that the dielectric part 128a may be made of other dielectric materials such as quartz glass, AlN, sapphire, SiN, and ceramic. Each dielectric part 128a has an asperity formed on a surface opposed to the substrate G.

The bottom surfaces of the slot antennas 126 are provided with a lattice beam 130. The lattice beam 130 supports the dielectric parts 128a and securely fastens them on the ceiling surface of the processing chamber 100. The beam 130 is made of electrically conductive material such as nonmagnetic metal such as aluminum. The beam 130 has a plurality of gas inlet pipes 132 passing therethrough. Each gas inlet pipe 132 has an opening A provided at an end. The opening A faces downward to introduce gases toward the substrate G.

A gas source 134 controls opening and closing of a valve and opening of a mass flow controller (either not shown). Desired gases thus pass through a gas flow channel 136 and are supplied downward from the openings A of the gas inlet pipes 132.

A coolant source 140 is connected to coolant piping 138. Coolant supplied from the coolant source 140 circulates through the coolant piping 138 back to the coolant source 140, thereby keeping the lid 102 at a desired temperature.

Thus, the microwave plasma processing system 10 transmits the microwave from a not-shown microwave generator through the six waveguides 124, the slots 126a of the slot antennas 126, and the dielectric parts 128a, into the interior of the processing chamber 100. The electric field energy of the microwave thus supplied generates a plasma from the gases supplied into the processing chamber 100. The generated plasma applies a desired plasma process to the substrate G in the processing chamber U.

(Measurement Device)

A description is now given of the measurement device 20 that measures the high-frequency electric power immediately below the substrate in the microwave plasma processing system 10.

The measurement device 20 includes two probes 142a and 142b and an oscilloscope 144. The probe 142a has one end connected to the top metal plate of the capacitor 108a. The probe 142b has one end connected to the bottom metal plate of the capacitor 108a. The other ends of the probes 142a and 142b pass through the wall of the processing chamber 100. The probe ends then connect to the oscilloscope 144 outside the processing chamber 100. The oscilloscope 144 is grounded.

The oscilloscope 144 measures the voltages $V_1$ and $V_2$ at the pair of plates of the capacitor 108a. The oscilloscope 144 then outputs the measured voltages $V_1$ and $V_2$ to the control system 148. The measurement device 20 thus measures the high-frequency electric power (voltage) applied to the capacitor 108a via the power-supply line 114 from the high-frequency power supply 112 as a parameter to control the plasma.

In addition to the voltages at the pair of plates of the capacitor 108a, the parameter to control the plasma may be, for example, at least one of the current and the phase. Note that the wall of the processing chamber 100 through which the probes 142a and 142b pass has O rings 146a and 146b provided thereto. The O-rings seal the processing chamber 100.

(Control System)

Figure 2:
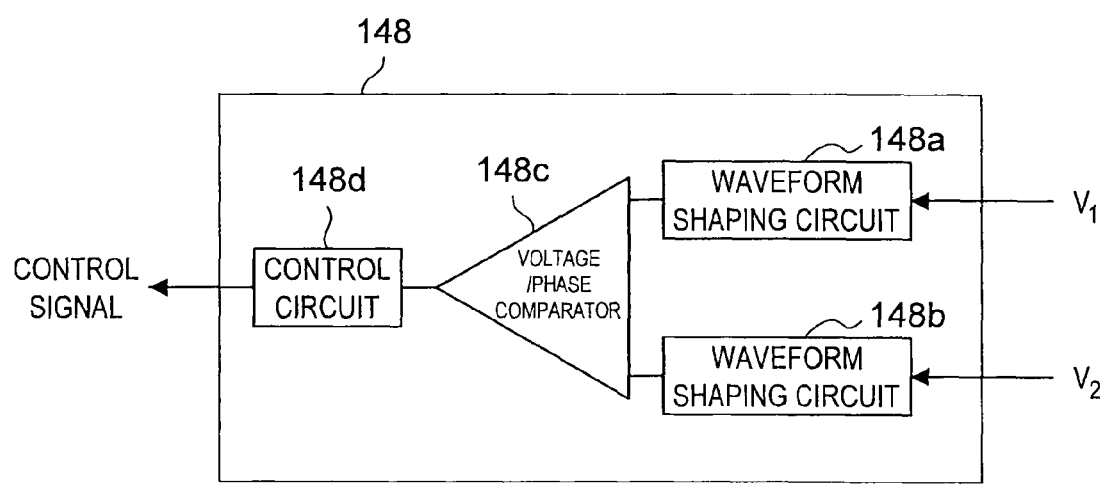
FIG. 2 is an internal structure diagram of a control system.

FIG. 2 shows a hardware configuration of the control system 148. The control system 148 controls the high-frequency electric power using the voltages $V_1$ and $V_2$ measured by the measurement device 20. With reference to FIG. 2, the control system 148 will be described below. The control system 148 includes two waveform-shaping circuits 148a and 148b, a voltage/phase comparator 148c, and a control circuit 148d. The waveform-shaping circuits 148a and 148b receive the potentials $V_1$ and $V_2$, respectively, which are measured by the measurement device 20. The circuits then shape the potential waveforms, respectively. The voltage/phase comparator 148c receives the waveform-shaped voltages $V_1$ and $V_2$. The comparator 148c then determines the phase difference between the voltages $V_1$ and $V_2$. The control circuit 148d uses the amplitude difference and the phase difference between the waveform-shaped voltages $V_1$ and $V_2$ to determine the power P applied to the susceptor 106. A method of computing the power P will be described specifically below.

First, each of the voltages $V_1$ and $V_2$ at the pair of plates of the capacitor is split into frequency components (i.e., harmonic components with the frequency of the high-frequency signal from the high-frequency power supply being the fundamental wave) as the following expression (1). k is the degree of the harmonic and I is the position of the measurement point. The coefficients are determined by the least squares method.

[eq. 2]

$$V_1(t) = \sum_k (a_k \cos(k\omega t) + b_k \sin(k\omega t)) \quad (1)$$
$$= \sum_k M_{V1k} \cos(k\omega + \varphi_{V1k})(\omega = 2\pi f)$$
$$V_2(t) = \sum_k (c_k \cos(k\omega t) + d_k \sin(k\omega t))$$
$$= \sum_k M_{V2k} \cos(k\omega + \varphi_{V2k})$$

The difference between the voltages $V_1$ and $V_2$ is represented as the following expression (2).

[eq. 3]

$$\Delta V = V_2 - V_1 \quad (2)$$
$$= \sum_k ((c_k - a_k)\cos(k\omega t) + (d_k - b_k)\sin(k\omega t))$$
$$= \sum_k M_{\Delta Vk} \cos(k\omega t + \varphi_{\Delta Vk})$$

Then, the amplitude $M_k$ and the phase $\phi_k$ of the current are calculated for each frequency. Specifically, instead of multiplying δV by jωc to determine the current I flowing into the capacitor, the following calculations are done. The amplitude difference $M_{\delta Vk}$ between the voltages $V_1$ and $V_2$ is multiplied by kωC. The phase difference $\phi_{\delta Vk}$ between the voltages $V_1$ and $V_2$ is added with π/2. The results are $M_{Ik}$ and $\phi_{Ik}$, giving the following expression (3).

[eq. 4]

$$I = \Delta V \times j\omega C \Rightarrow M_{Ik} = M_{\Delta Vk} \times k\omega C, \quad \varphi_{Ik} = \varphi_{\Delta Vk} + \frac{\pi}{2} \quad (3)$$

From the effective values and the power factors ($\cos(\phi_{Ik} - \phi_{VIk})$) of the amplitudes $M_{Ik}$ and $M_{VIk}$, the power P applied to the capacitor is determined by the following expression (4).

[eq. 1]

$$P = \sum_k \frac{M_{Ik} \times M_{VIk}}{2} \times \cos(\varphi_{Ik} - \varphi_{VIk}) \quad (4)$$

In this way, the power P is determined from the two actual measurements $V_1$ and $V_2$ in the vicinity of the substrate. It is believed that the power P is approximately equal to the high-frequency electric power immediately below the substrate, i.e., the power available for the control of the plasma. The measurement errors included in the power P computed from the expression (4) may be made sufficiently small by setting the capacitor capacitance to 4.2 times (preferably 2.1 times) or less than the sheath capacitance. The actual measurements of the voltages $V_1$ and $V_2$ at the pair of plates of the capacitor having a capacitance of 4.2 times (preferably 2.1 times) or less than the sheath capacitance are used to determine the high-frequency electric power P applied to the susceptor 106 using the expression (4). The power available for the control of the plasma may thus be accurately understood.

The control circuit 148d uses the computed power to determine the power to be supplied from the high-frequency power supply 112 to perform the targeted desired process. The circuit 148d then outputs a control signal including the determined power information to the high-frequency power supply 112. The high-frequency power supply 112 thus outputs a high-frequency signal of the desired high-frequency electric power. The power immediately below the substrate G may thus be controlled to the desired value. The process speed such as the etching speed may thus be more accurately controlled, thereby plasma-processing the substrate G more accurately. The feedback control of the power by the control system 148 according to the measurement results will be described below.

(Sheath Voltage)

The plasma generated in the processing chamber 100 includes charged particles including electrons and ions. The electrons are light and thus move rapidly. The ions are heavy and thus move slowly compared to the electros. When the plasma is generated, therefore, the electrons in the plasma first collide with the surfaces of the interior wall of the processing chamber 100 and the substrate G. The electrons then couple with the ions at the wall surfaces. The surfaces of the interior wall of the processing chamber 100 and the substrate G then lose the ions, thus becoming negatively charged. The negatively charged surfaces of the interior wall of the processing chamber and the substrate repel the electrons and attract the ions. These surfaces are thus covered by positive charges. The positive charges are generally referred to as a space charge, i.e., a sheath.

Figure 3A:
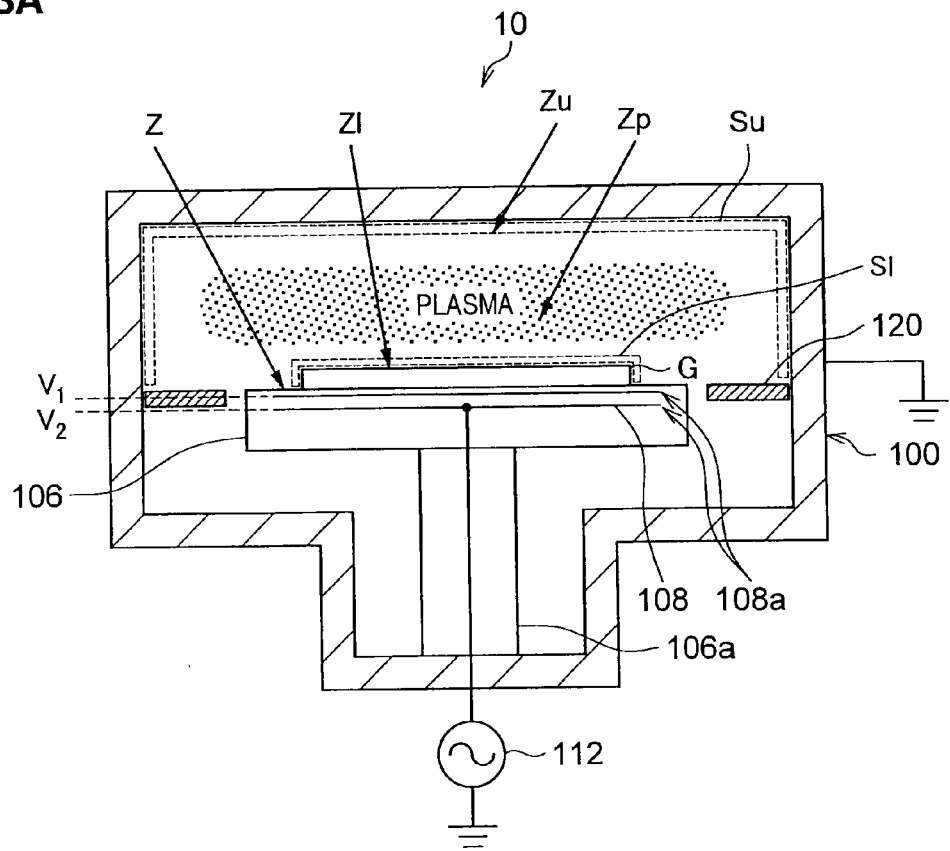
FIG. 3A illustrates electrical condition in a processing unit.

FIG. 3A shows a model of the microwave plasma processing system 10. Over the baffle plate 120 is a ground sheath Su formed at the internal wall surface of the processing chamber 100. At the surface of the substrate G is formed an electrode sheath Sl. The potentials of the sheaths Su and Sl serve to attract the heavy ions to the respective surfaces. In particular, the potential Vdc of the electrode sheath Sl mainly determines the energy by which the ions in the plasma collide with the substrate G. Accurate control of the potential Vdc of the electrode sheath Sl may thus accurately control the etching speed and the film quality and the like.

(Measurement Errors)

For the accurate control of the potential Vdc of the electrode sheath Sl, the high-frequency power supply 112 should be accurately controlled. To do so, the capacitor 108a should have a capacitance of 4.2 times or less than the sheath capacitance, as described above. The applicants have proved that in the determination of the power P from the voltages $V_1$ and $V_2$ at the pair of plates of the capacitor 108a, the capacitor 108a having a capacitance of 4.2 times or less than the sheath capacitance may reduce the measurement errors included in computed power P to acceptable levels. This is described in more detail below.

With the amplitude ratio of the voltages $V_1$ and $V_2$ at the pair of plates of the capacitor 108a being $\alpha_k$ ($=M_{V1K}/M_{V2k}$) and the phase difference of the voltages $V_1$ and $V_2$ being $\varphi_k$, the phase $\theta_k$ and the amplitude $M_{\delta Vk}$ of $\delta V$ ($=V_2-V_1=I/j\omega C$) are expanded as follows. k is the degree of the harmonic.

$$\frac{I}{j\omega C} = \Delta V = V_2 - V_1 \quad [\text{eq. 5}]$$
$$= \sum_k M_{V2k}(\cos k\omega t - \alpha_k \cos(k\omega t + \varphi_k))$$
$$= \sum_k M_{V2k}((1 - \alpha_k \cos\varphi_k)\cos k\omega t + \alpha_k \sin\varphi_k \sin k\omega t)$$
$$= \sum_k M_{\Delta Vk} \cos(k\omega t + \theta_k)$$

$$M_{\Delta Vk} = M_{V2k}\sqrt{(1 - \alpha_k \cos\varphi_k)^2 + \alpha_k^2 \sin^2\varphi_k}$$

$$\theta_k = -\tan^{-1}\frac{\alpha_k \sin\varphi_k}{1 - \alpha_k \cos\varphi_k}$$

Figure 3B:
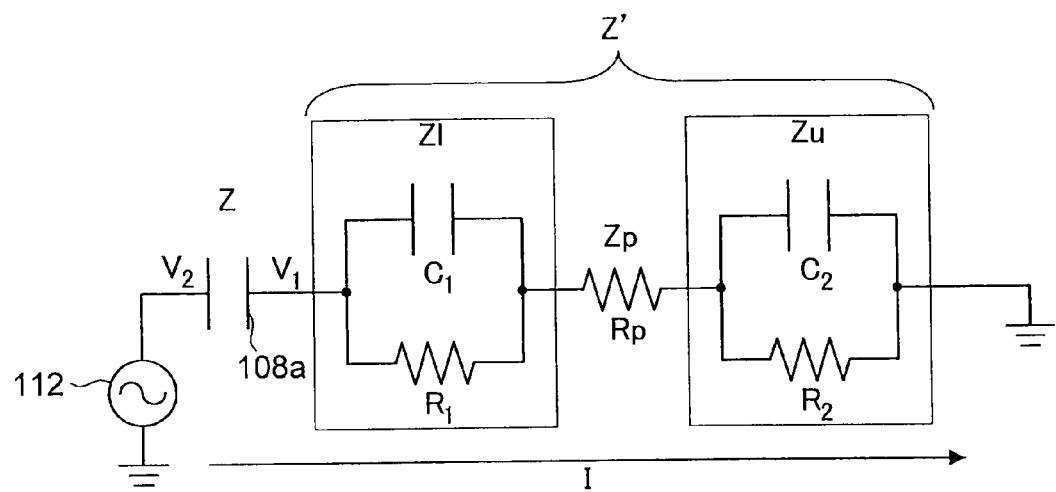
FIG. 3B shows an equivalent circuit.

FIG. 3B shows an equivalent circuit for the model of the microwave plasma processing system 10 in FIG. 3A. With reference to FIG. 3B, the applicants have considered the estimation of the errors in the measurement power P. The impedance Zu of the ground sheath Su has a capacitive component C2 and an inductive component R2. The impedance Zl of the electrode sheath Sl has a capacitive component C1 and an inductive component R1. Between the ground sheath Su and the electrode sheath Sl, the impedance Zp of the plasma having an inductive component $R_p$ exists. In addition to the total Z' of the impedance (Zu, Zl, and Zp), the microwave plasma processing system 10 in this embodiment also has an impedance Z associated with the additional capacitor 108a.

The following expression then holds.

$$v = 1/\alpha_k = V_2/V_1 = (Z+Z')/Z' = Z/Z'+1.$$

This expression is used to evaluate the absolute values of the phase difference ($-\varphi_k$) and the voltage ratio $V_2/V_1$ ($=1/\alpha_k$ ($=M_{V2k}/M_{V1K}$)). The condition for the evaluation is $R_p\sim 0$ and $R_{1,2} \gg 1/\omega C_{1,2}$ ($=1/\omega C$).

(Phase Evaluation)

Figure 4:
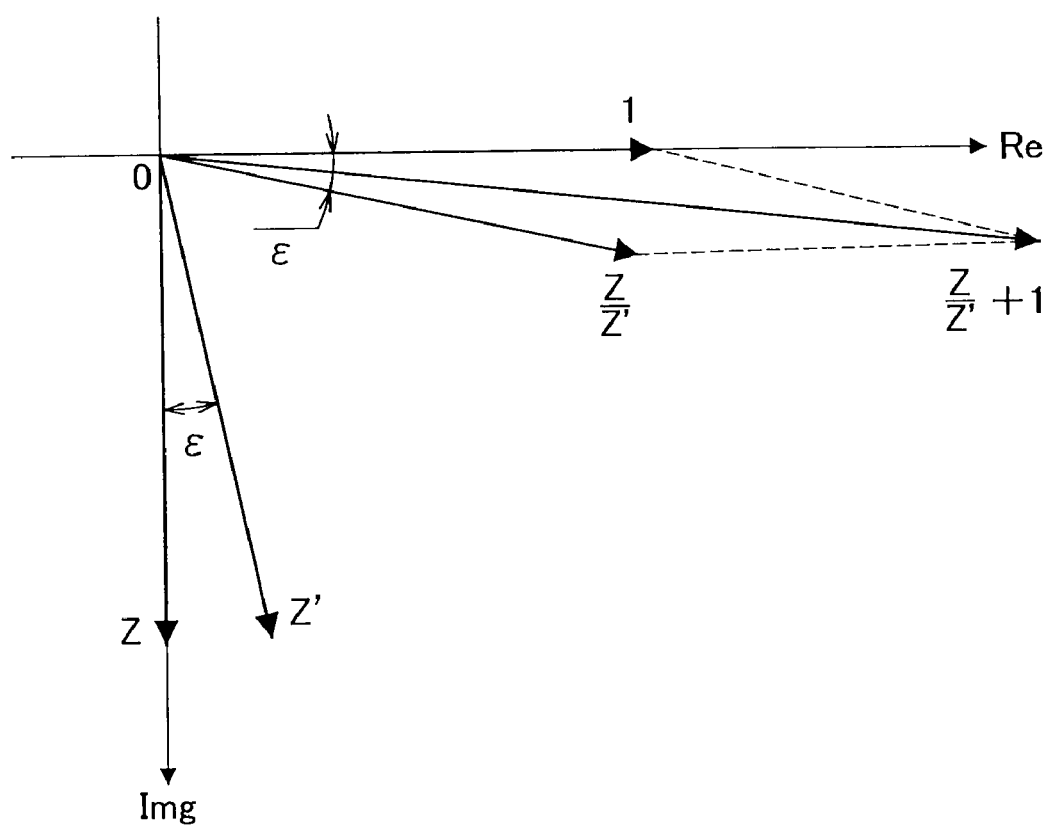
FIG. 4 shows the relationship between Z and Z' in a complex plane.

First, the phase difference $\varphi$ between the voltages $V_2$ and $V_1$ is evaluated. FIG. 4 shows the relationship between Z, Z', and the angle $\in$ in a complex plane with the x-axis representing the real number and the y-axis representing the imaginary number.

The voltage ratio and the impedance ratio are represented by the following expression, as described above.

$$V_2/V_1 = Z/Z'+1$$

FIG. 4 gives the following expression.

$$arg(Z) = -\pi/2$$

$$arg(Z') = -\pi/2 + \in$$

$$arg(Z/Z') = \in$$

These expressions lead to the following expression.

$$|arg(v)| = |arg(Z/Z'+1)| < |\in|$$

Because of $R_p \sim 0$ and $R_{1,2} \gg 1/\omega C$, $|\in|$ is a very small value and arg (v) may be approximated as arg (v)$\sim$0. The absolute value of the phase difference $\varphi$ between the voltages $V_2$ and $V_1$ may thus be a small value regardless of the capacitance C of the capacitor 108a.

(Evaluation of Absolute Value of Voltage Ratio)

Then, the absolute value of the voltage ratio $V_2/V_1$ is evaluated. The absolute value of the voltage ratio $V_2/V_1$ is represented as follows from the above expression.

$$1/\alpha = |v| = V_2/V_1 = |Z/Z'+1|$$

$$Z/Z' \sim C_1 C_2/(C_1+C_2)C$$

Where $R_{1,2} \gg 1/\omega C$ and $R_p \sim 0$.

Figure 5:
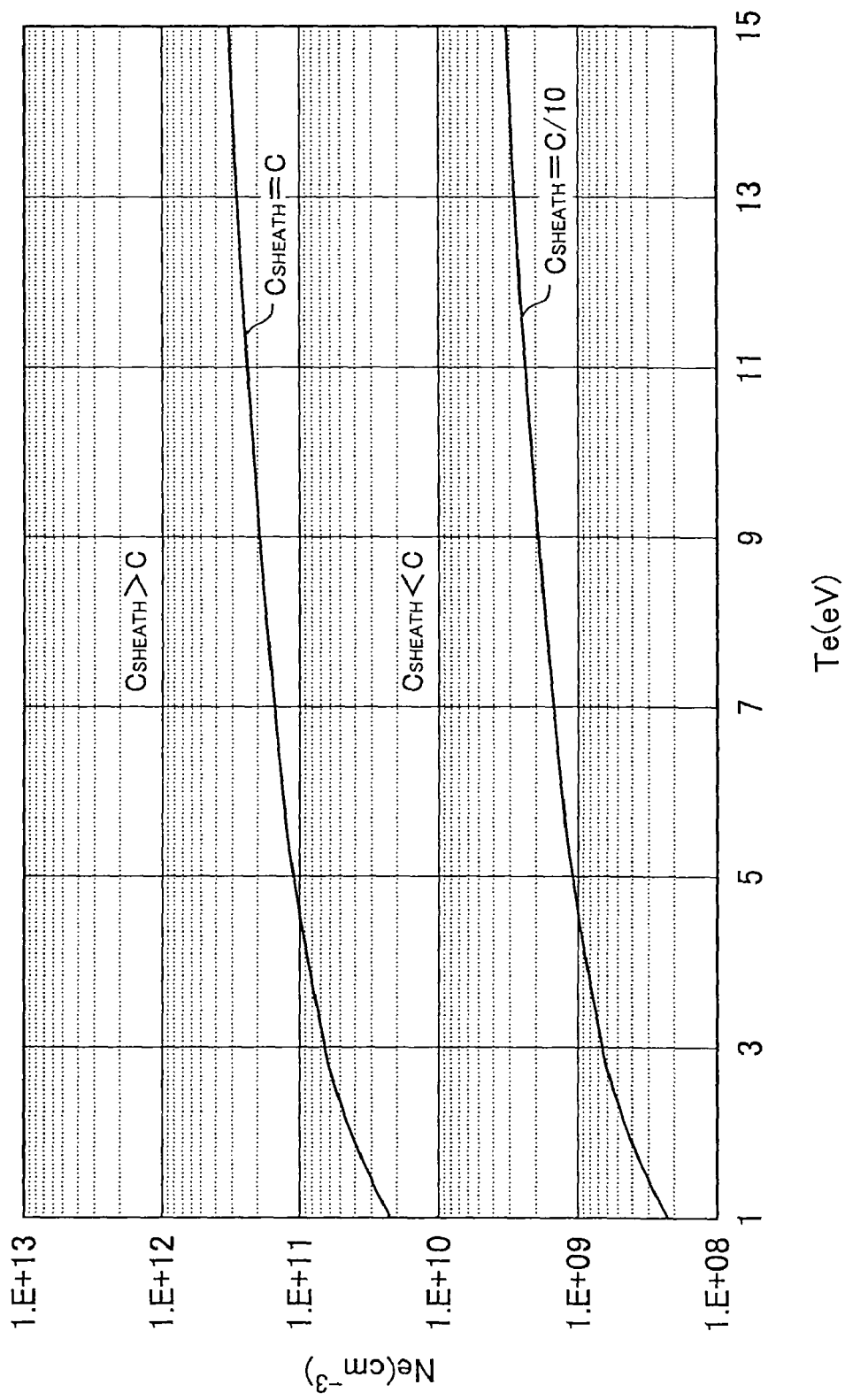
FIG. 5 is a graph of the variation of the absolute value of $V_2/V_1$ to the variation of the plasma state according to the magnitude relation between capacitor capacitance C and sheath capacitance $C_{sheath}$.

FIG. 5 is a graph with the x-axis representing the electron temperature Te (eV) and the y-axis representing the electron density Ne (cm$^{-3}$). The graph shows how the absolute value of $V_2/V_1$ varies with the magnitude relation between the capacitor capacitance C and the sheath capacitance $C_{sheath}$. The graph shows that the plasma's condition represented by the electron temperature Te and the electron density Ne changes the absolute value of the $V_2/V_1$. When the sheath capacitance $C_{sheath}$ is approximately equal to the capacitor capacitance C, the actual measurement of $\alpha=|V_1/V_2|=0.667$ causes the absolute value of the $V_2/V_1$ to approach asymptotically to "1.5".

When the sheath capacitance $C_{sheath}$ is approximately equal to $\frac{1}{10}$ of the capacitor capacitance C, the actual measurement of $\alpha=|V_1/V_2|=0.952$ causes the absolute value of the $V_2/V_1$ to approach asymptotically to "1.05".

(Error Estimation)

The amplitude a of each of the actual measurements $V_1$ and $V_2$ has an error $\delta\alpha_k$. The phase $\varphi$ of each of the actual measurements $V_1$ and $V_2$ has an error $\delta\varphi_k$. The effects of the errors $\delta\alpha_k$ and $\delta\varphi_k$ on the amplitude difference $M_{\delta Vk}$ between the voltages $V_1$ and $V_2$ and on the phase difference $\varphi_k$ between the voltages $V_1$ and $V_2$ are estimated by calculating each partial differential.

[eq. 6]

$$\frac{\partial M_{\Delta Vk}}{\partial \alpha_k} = M_{V2k} \cdot \frac{\alpha_k - \cos\varphi_k}{\sqrt{1 - 2\alpha_k \cos\varphi_k + \alpha_k^2}} \quad (5)$$

$$\frac{\partial \theta_k}{\partial \alpha_k} = -\frac{\sin\varphi_k}{1 - 2\alpha_k \cos\varphi_k + \alpha_k^2} \quad (6)$$

$$\frac{\partial M_{\Delta Vk}}{\partial \varphi_k} = M_{V2k} \cdot \frac{\alpha_k \sin\varphi_k}{\sqrt{1 - 2\alpha_k \cos\varphi_k + \alpha_k^2}} \quad (7)$$

-continued $$\frac{\partial \theta_k}{\partial \varphi_k} = \frac{\alpha_k^2 - \alpha_k \cos\varphi_k}{1 - 2\alpha_k \cos\varphi_k + \alpha_k^2} \quad (8)$$

$M_{\delta Vk}$ is the amplitude difference between $V_1$ and $V_2$. $\phi_k$ is the phase difference between $V_1$ and $V_2$. $M_{V2k}$ is the amplitude of $V_2$. $\alpha_k$ is the ratio of the absolute values of $V_1$ and $V_2$. $\phi_k$ is the phase difference between $V_1$ and $V_2$.

the above phase evaluation shows that the phase difference $\phi_k$ approaches approximately "0". The behaviors of the expressions (5) to (8) in the vicinity of $\phi_k=0$ are approximately represented as follows.

[eq. 7]

$$\frac{\partial M_{\Delta Vk}}{\partial \alpha_k} \Rightarrow M_{V2k} \cdot \frac{\alpha_k - 1}{1 - \alpha_k} = -M_{V2k} \quad (5)$$

$$\frac{\partial \theta_k}{\partial \alpha_k} \Rightarrow -\frac{\varphi_k}{(1-\alpha_k)^2} \quad (6)$$

$$\frac{\partial M_{\Delta Vk}}{\partial \varphi_k} \Rightarrow M_{V2k} \cdot \frac{\alpha_k \varphi_k}{1-\alpha_k} \quad (7)$$

$$\frac{\partial \theta_k}{\partial \varphi_k} = \frac{\alpha_k}{\alpha_k - 1} \quad (8)$$

$M_{V2k}$ is the amplitude of $V_2$. $\alpha_k$ is the ratio of the absolute values of $V_1$ and $V_2$. $\theta_k$ is the phase of $V_1$ and $V_2$. $\phi_k$ is the phase difference between $V_1$ and $V_2$.

Consider the expressions (5) to (8) thus approximated. The expression (8) diverges on the condition that $\alpha_k$ approaches asymptotically to "1". This means that the measurement errors of the phases of $V_1$ and $V_2$ have more effect on the phase errors of $V_2-V_1$ ($=I/j\omega C$).

As for the expression (6), it is "0" at $\phi=0$. It has a large value when $\alpha_k$ approaches asymptotically to "1" because the denominator includes $(1-\alpha_k)^2$. The fact that the expression (6) has a large value means that the calculation errors of the absolute values of $V_1$ and $V_2$ may contribute to the phase errors.

In any case, $\alpha_k$ (the ratio of the absolute values of $V_1$ and $V_2$) approaches asymptotically to "1" i.e., 1E+10 in FIG. 5 when the electron density (plasma density) Ne is low or the electron temperature Te is high. This condition easily generates the errors.

(Measurement)

Figure 6:
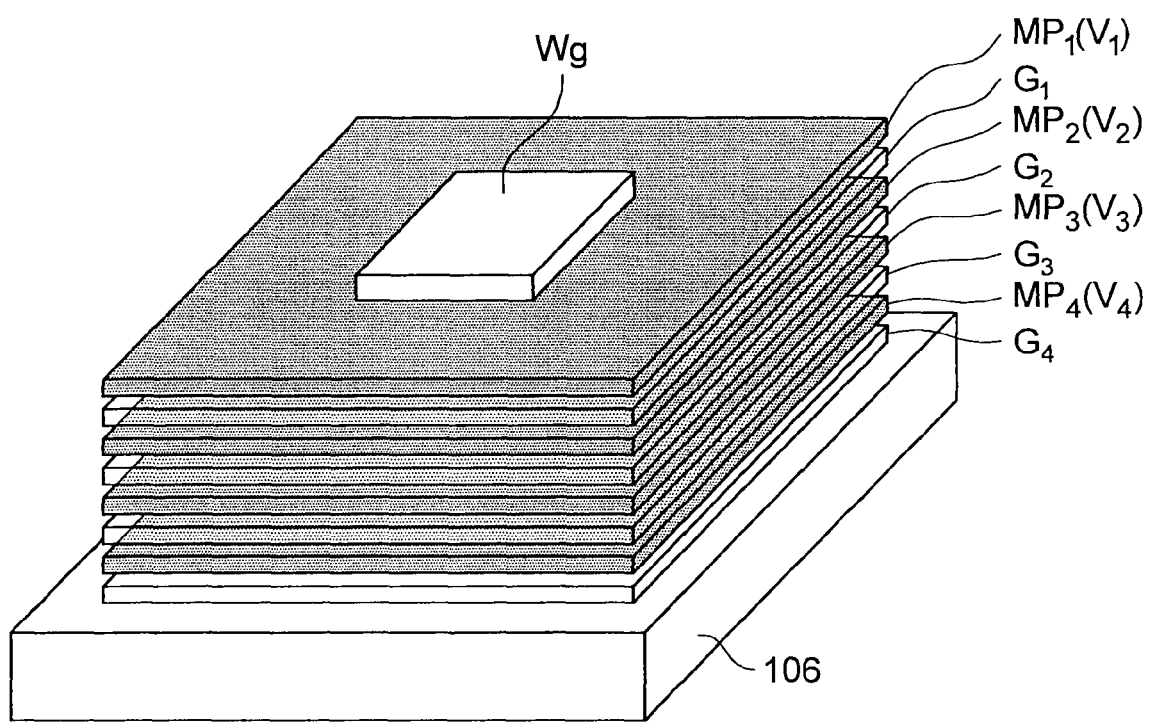
FIG. 6 is an enlarged view of the vicinity of an electrode of an experimental apparatus.

According to the above error estimation, the applicants performed the actual measurements using the microwave plasma processing system 10 having the capacitor 108a. With reference to FIG. 6, the applicants disposed a laminate on the susceptor 106. The laminate included eight plates of the same area, a glass substrate $G_4$, a metal electrode $MP_4$, a glass substrate $G_3$, a metal electrode $MP_3$, a glass substrate $G_2$, a metal electrode $MP_2$, a glass substrate $G_1$, and a metal electrode $MP_1$ in this order from the susceptor 106. A weight of an aluminum plate Wg was disposed on the top to stabilize the capacitance between each metal electrode.

The capacitor capacitance C was set to 4.2 times or less than the sheath capacitance. Specifically, each capacitance was as follows. The capacitor having the metal electrodes $MP_4$ and $MP_3$ had a capacitance $C_{43}$ of $1.001 \times 10^{-8}$ (F). The capacitor having the metal electrodes $MP_3$ and $MP_2$ had a capacitance $C_{32}$ of $1.019 \times 10^{-8}$ (F). The capacitor having the metal electrodes $MP_2$ and $MP_1$ had a capacitance $C_{21}$ of $1.015 \times 10^{-8}$ (F).

Before measurement, the oscilloscope was calibrated as follows. All probes were attached to the aluminum plate Wg on the top. The probes were then used to measure the same signal. The measured waveforms were used to create a table to correct the amplitudes and phases between the channels.

The process condition is that a microwave of 5500 W or 3000 W was supplied from the upper portion of the processing chamber 100. The high-frequency power supply 112 at the lower portion output the high-frequency electric power of 100 W. The pressure of the processing chamber U was controlled to 30 mTorr. As the process gas, an Argon (Ar) gas of 500 sccm was introduced.

The experimental apparatus thus set was used to perform the process. During the process, the applicants used the four metal electrodes $MP_1$ to $MP_4$ to measure the voltages $V_1$ to $V_4$. The applicants then determined the potential difference ($V_2/V_1$, $V_3/V_2$, $V_4/V_3$) between each voltage. FIG. 7 shows the results.

FIG. 7 shows the results for the microwave's power $P_\mu$ of 3000 W and 5500 W and the high-frequency electric power $P_{rf}$ of 100 W and 500 W. Specifically, FIG. 7 shows the measurements of the electrode voltages ($V_1$ to $V_4$) and the voltage-amplitude ratios ($V_2/V_1$, $V_3/V_2$, $V_4/V_3$) computed from the measurements. The applicants performed the measurements and determinations as follows. First, each electrode voltage (V) and each phase (rad) were measured for the microwave's power $P_\mu$ of 3000 W and the high-frequency electric power $P_{rf}$ of 100 W and 500 W. From these measurements, the voltage-amplitude ratios were determined. Then, each electrode voltage (V) and each phase (rad) were measured for the microwave's power $P_\mu$ of 5500 W and the high-frequency electric power $P_{rf}$ of 100 W and 500 W. From these measurements, the voltage-amplitude ratios were determined.

The applicants then used each of the measured electrode voltages (V) and measured phases (rad) to compute the current waveforms ($I_{21}$, $I_{32}$, $I_{43}$) and power ($P_{21}$, $P_{32}$, $P_{43}$) using the expression (4). The results are shown in FIG. 8. The results show that for the microwave's power of 5500 W, the current waveforms and power in FIG. 8 calculated from each substrate's electrode potential ($V_4$, $V_3$, $V_2$, $V_1$) in FIG. 7 coincide relatively well, but they coincide poorly for the power of 3000 W.

These results are consistent with the considerations in the expressions (5) to (8). Specifically, when the plasma density (electron density Ne) is not high or low, but moderate as for the microwave's power $P_\mu$ of 5500 W, the sheath capacitance $C_{sheath}$ is approximately equal to the capacitor capacitance C as shown in FIG. 5 and the absolute value of the $V_2/V_1$ approaches asymptotically to "1.5", so it is hard to have errors for any value of the capacitor capacitance C. When, on the other hand, the plasma density (electron density Ne) is low as for the microwave's power $P_\mu$ of 3000 W, the sheath capacitance $C_{sheath}$ is approximately equal to $\frac{1}{10}$ of the capacitor capacitance C and the absolute value of the $V_2/V_1$ approaches asymptotically to "1.05", so it is easy to have errors.

With reference to FIG. 7, the voltage-amplitude ratio depends on the microwave's power, but not on the high-frequency electric power. For the microwave's power of 5500 W, each ratio ranges approximately from 1.26 to 2. For the microwave's power of 3000 W, each ratio ranges approximately from 1.11 to 1.28. The applicants have thus found that with the current measurement accuracy, the measurement errors increase when the voltage-amplitude ratio is less than about 1.2, i.e., the measurement accuracy degrades when the voltage-amplitude ratio is less than about 1.2. The applicants have also found that to reliably alleviate the measurement errors, the voltage-amplitude ratio should be about 1.4.

(Optimization of Capacitor Capacitance)

From the above experimental results, the applicants have had following consideration on the optimum value of the capacitor capacitance for the acceptable measurement errors. As described above, the phase evaluation in the error estimation attempted by the applicants show that the phase difference $\phi_k$ is approximately equal to "0." With reference to FIG. 3A, therefore, the capacitor impedance Z, and the total Z' of the ground sheath impedance Zu, the electrode sheath impedance Zl, and the plasma impedance Zp may be approximated by real numbers to derive the relationship between the sheath capacitance $C_{sheath}$ and the capacitor capacitance C as follows.

Assume here that $C_{sheath}=C_2$ (the ground sheath capacitance in FIG. 3B)=$\psi C_1$ (the electrode sheath capacitance). As described above, $v=1/\alpha_k=V_2/V_1=(Z+Z')/Z'=1+Z/Z'$, and $Z/Z'\sim C_1 C_2/(C_1+C_2)C$. Substituting the above capacitance relationship into these expressions yields, therefore, the following expression.

$$v=1+Z/Z'=1+\psi \times C_{sheath}^2/\{(1+\psi) \times C_{sheath} \times C\}.$$

From the above results in which with the current measurement accuracy, the measurement error increases when the voltage-amplitude ratio is less than about 1.2, the following relationship between $C_{sheath}$ and C may be derived.

$$1+\psi \times C_{sheath}^2/\{(1+\psi) \times C_{sheath} \times C\} >= 1.2 \qquad (9).$$

When $\psi$ equals "1," i.e., the sheath capacitance $C_{sheath}$ is equal to the electrode sheath capacitance $C_1$ and the ground sheath capacitance $C_2$) for the upper and lower portions, the sheath capacitance $C_{sheath}$ has a coefficient $5\psi/(1+\psi)$ of 2.5. Note, however, that $\psi$ equals "1" when the ground sheath capacitance equals the electrode sheath capacitance. Considering the width of the sheath region when the plasma is generated, it is hard to believe that the ground sheath capacitance is equal to the electrode sheath capacitance. Alternatively, it may be believed that the ground sheath capacitance is actually about 1.5 to 5 times the electrode sheath capacitance. Assuming $\psi=1.5$ to 5, the expression (9) shows that $\psi$ of "1.5" gives the capacitor capacitance C of three times or less than the sheath capacitance $C_{sheath}$ and $\psi$ of "5" gives the capacitor capacitance C of 4.2 times or less than the sheath capacitance $C_{sheath}$. The applicants thus have concluded that the capacitor capacitance C for the acceptable measurement errors is 4.2 times or less than the sheath capacitance $C_{sheath}$.

To reliably alleviate the measurement errors, the voltage-amplitude ratio should be about 1.4 as described above. The following expression holds for this value.

$$1+\psi \times C_{sheath}^2/\{(1+\psi) \times C_{sheath} \times C\} >= 1.4 \qquad (10).$$

Again, assuming $\psi=1.5$ to 5, the expression (10) shows that $\psi$ of "1.5" gives the capacitor capacitance C of 1.5 times or less than the sheath capacitance $C_{sheath}$ and $\psi$ of "5" gives the capacitor capacitance C of 2.1 times or less than the sheath capacitance $C_{sheath}$. The applicants thus have concluded that the capacitor capacitance C to reliably alleviate the measurement errors is 2.1 times or less than the sheath capacitance $C_{sheath}$.

The above experimental results have shown that in the measurement device 20 in this embodiment, the power of the capacitor 108a may be accurately measured when the capacitance C of the capacitor 108a is 4.2 times or less than the sheath capacitance $C_{sheath}$ and the reliable alleviation of the errors is preferably performed when the capacitance C of the capacitor 108a is 2.1 times or less than the sheath capacitance $C_{sheath}$. The measurements with the capacitor 108a having the above capacitance C may be used to optimize the design (such as the configuration and material of the processing unit to be designed) to efficiently use the high-frequency electric power by the plasma control.

The above consideration and experiments show that the measurement errors increase when the capacitance C of the capacitor 108a provided for the measurement is five times or more than the sheath capacitance $C_{sheath}$. The applicants thus have found that the capacitor capacitance C for the measurements should be 4.2 times or less than the sheath capacitance and be sufficiently small (preferably 2.1 times or less than the sheath capacitance).

The applicants have proposed a plurality of ways to set the capacitance C of the capacitor 108a to 4.2 times or less than the sheath capacitance $C_{sheath}$. With reference to FIG. 1, the first way is to dispose electrodes each having the same area as the substrate G in the susceptor 106 at a position opposed to the substrate G mounted on the susceptor 106 and sandwich the dielectric material 108b having a low dielectric constant between the electrodes. Alternatively, instead of sandwiching the dielectric material 108b having a low dielectric constant between the electrodes, the distance between the electrodes may be increased to set the capacitance C of the capacitor 108a to 4.2 times or less than the sheath capacitance $C_{sheath}$.

Setting the capacitance C of the capacitor 108a to 4.2 times or less than the sheath capacitance $C_{sheath}$ may thus largely reduce the measurement errors included in the measured voltages $V_1$ and $V_2$ of the electrodes. Note, however, that this method needs sufficiently small capacitance of the capacitor 108a even for different plasma conditions.

(Feedback Control)

With reference to the feedback-control flowchart in FIG. 13, a feedback control by the control system 148 will be described. Note that the storage area (not shown) in the control system 148 stores in advance a table showing the relationship between film quality D determined by the amount of ions mixed in the film and the power P to provide that film quality. Assume here that at the initial state the high-frequency power supply 112 outputs power Ps for the targeted film quality Ds.

Figure 13:
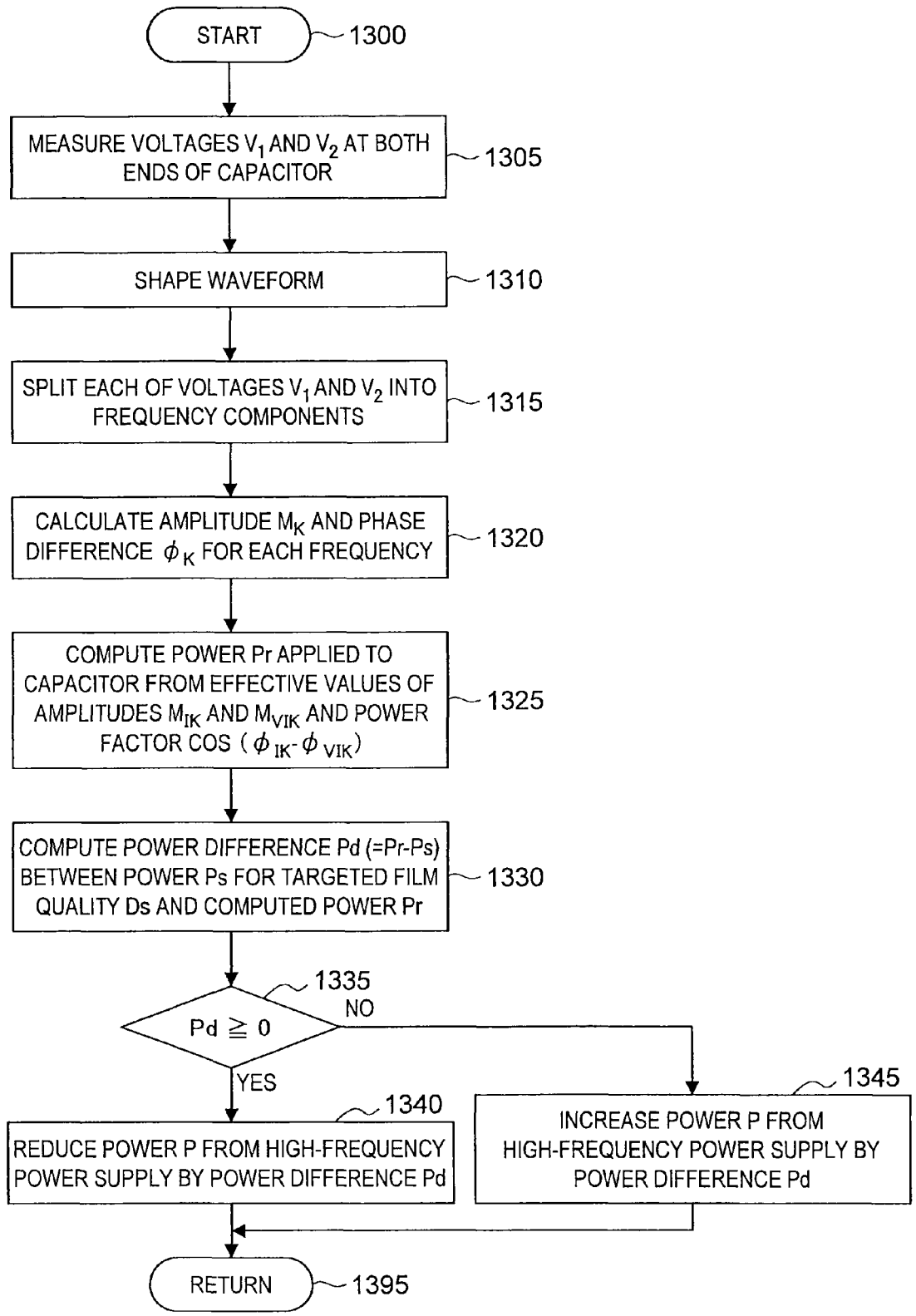
FIG. 13 shows a flowchart of a feedback control of high-frequency electric power.

With reference to FIG. 13, the feedback control by the control system 148 starts with step 1300. Then at step 1305, the control system 148 measures the voltages $V_1$ and $V_2$ at the pair of plates of the capacitor 108. At step 1310, the measured voltages $V_1$ and $V_2$ are waveform-shaped. At step 1315, each of the voltages $V_1$ and $V_2$ is split into frequency components, i.e., harmonic components with the power-supply frequency being the fundamental wave. The coefficients are determined by the least squares method. At step 1320, the amplitude $M_k$ and the phase difference $\phi_k$ at each frequency are calculated according to the expressions (1) to (3). At step 1325, the effective values based on the determined amplitudes $M_{Ik}$ and $MV_{Ik}$ and power factors $(\cos(\phi_{Ik}-\phi_{VIk}))$ based on the determined phase difference $\phi_k$ are substituted into the expression (4) to compute the power Pr applied to the capacitor.

Figure 14:
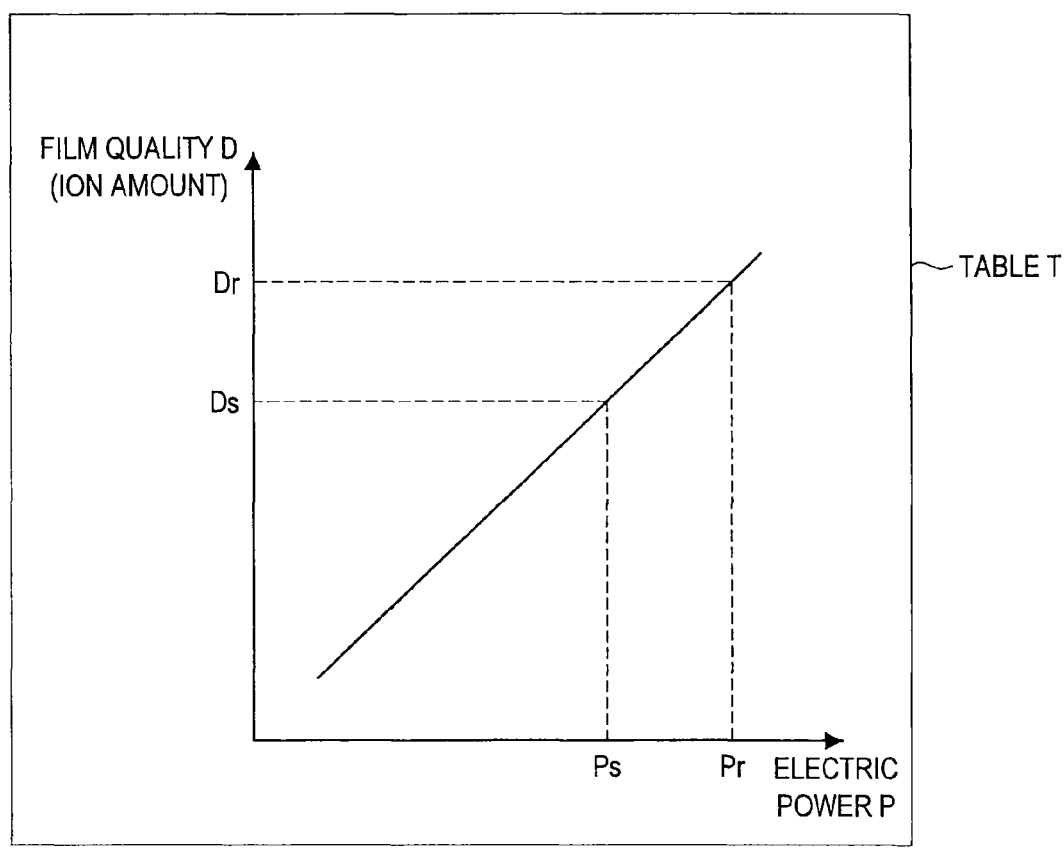
FIG. 14 is a table of the relationship between power and film quality.
Figure 15:
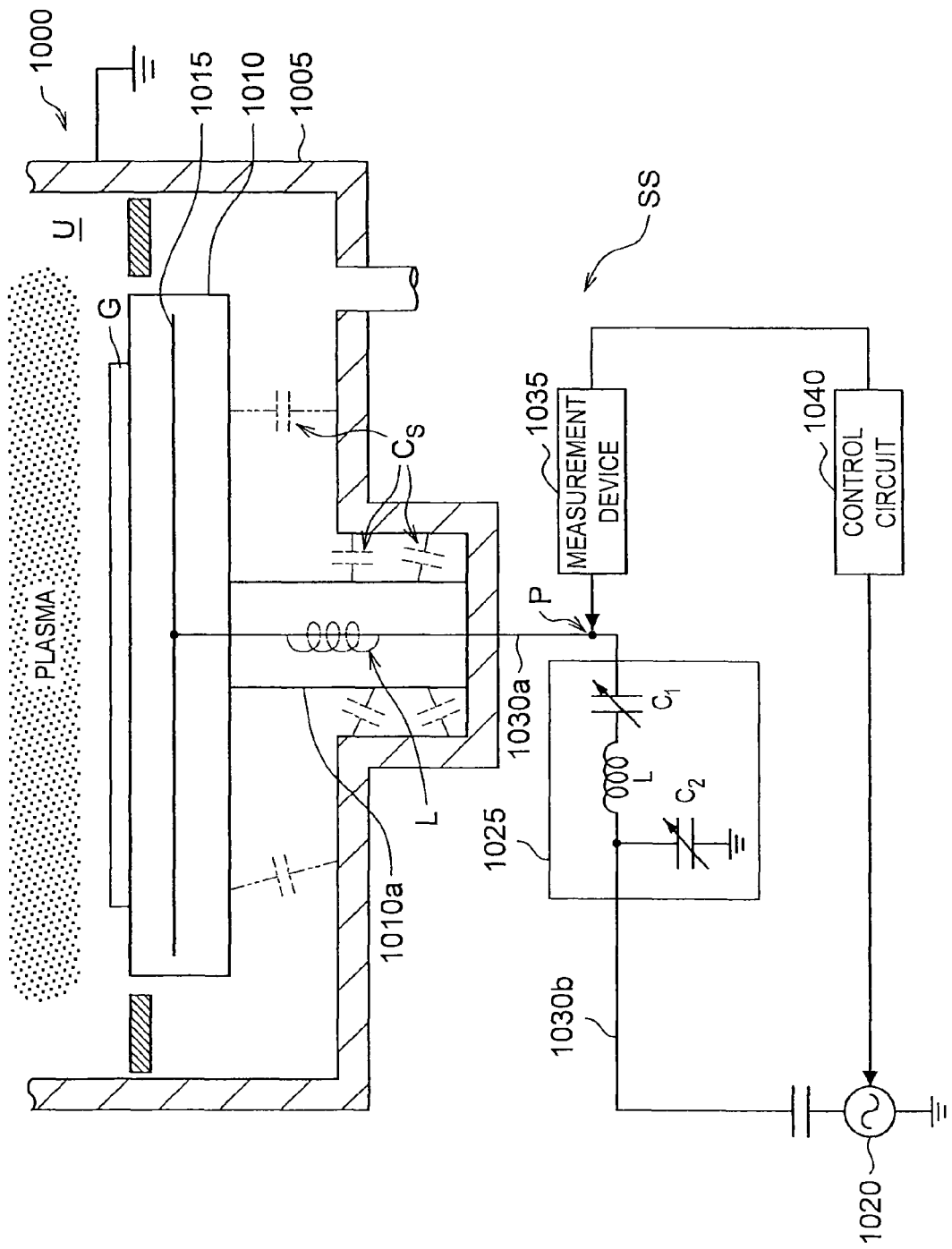
FIG. 15 is a configuration diagram of a system including an associated plasma processing system.

With reference to FIG. 14, when the power Pr is applied to the capacitor 108a (susceptor 106), the film quality Dr of the resulting film differs from the targeted film quality Ds and thus the film characteristics differ from the desired one. At step 1330, the power difference Pd (=Pr −Ps) between the power Ps for the targeted film quality Ds and the computed power Pr is computed according to the table T in FIG. 14. At step 1335, if it is determined that the power difference Pd is "0" or more, the power Pr applied to the capacitor 108a is larger than the ideal power Ps, as shown in the table T in FIG. 14. At step 1340, therefore, the control system 148 reduces the power P from the high-frequency power supply 112 by the power difference Pd and ends with step 1395. If, at step 1335, it is determined that the power difference Pd is less than "0," the power Pr applied to the capacitor 108a is less than the ideal power Ps. At step 1345, therefore, the control system 148 increases the power P from the high-frequency power supply 112 by the power difference Pd and ends with step 1395.

Thus, the control system 148 may be used to directly measure the high-frequency electric power applied to the susceptor 106, thereby feedback-controlling the power more accurately. This may allow the high-quality film to be deposited continuously and highly accurately regardless of the processing chamber conditions or the process types.

According to the expression (4), only data of the voltages $V_1$ and $V_2$ of the electrodes may be used to compute the power P without needing other data. Additionally, the power may be measured over the whole electrode. The very accurate measurements may thus be achieved. In this way, the voltages $V_1$ and $V_2$ at the pair of plates of the capacitor 108a having a capacitance of 4.2 times or less than the sheath capacitance may be actually measured, and the high-frequency electric power may be determined from the actual measurements, thereby understanding the high-frequency electric power immediately below the substrate, the electric power being available for the plasma control.

(First Modification)

Figure 9:
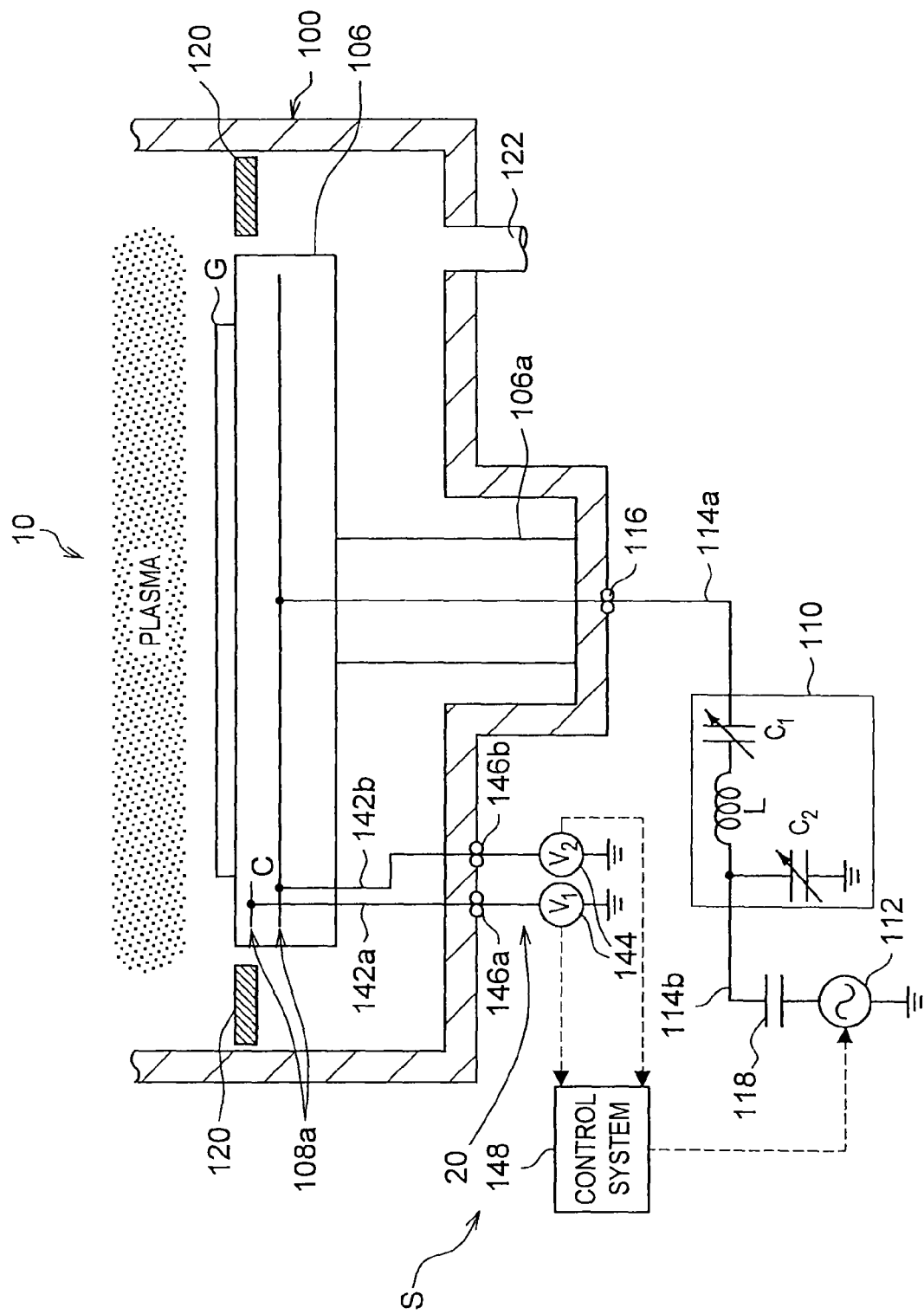
FIG. 9 is a configuration diagram of a measurement system including a microwave plasma processing system according to a first modification.

The second way proposed by the applicants to set the capacitance C of the capacitor 108a to 4.2 times or less than the sheath capacitance $C_{sheath}$ is as follows. With reference to FIG. 9, small electrodes (capacitor 108a) are formed at the end of the susceptor 106. This position is not opposed to the substrate G. i.e., has little effect on the plasma process.

In this method, like the first method, the voltages $V_1$ and $V_2$ at the pair of plates of the capacitor may be actually measured and the high-frequency electric power P of the susceptor 106 may be computed from the actual measurements, thereby deriving the high-frequency electric power immediately below the substrate, the electric power being available for the plasma control. Additionally, the method in the first modification may measure the voltages $V_1$ and $V_2$ with little effect on the plasma process. The capacitance of the capacitor 108a may easily be reduced. Note, however, that the voltages $V_1$ and $V_2$ are measured at a portion not opposed to the substrate, so when the voltages have large in-plane distributions in the electrodes or the like, errors may occur between the measurement results and the actual power values.

(Second Modification)

Figure 10:
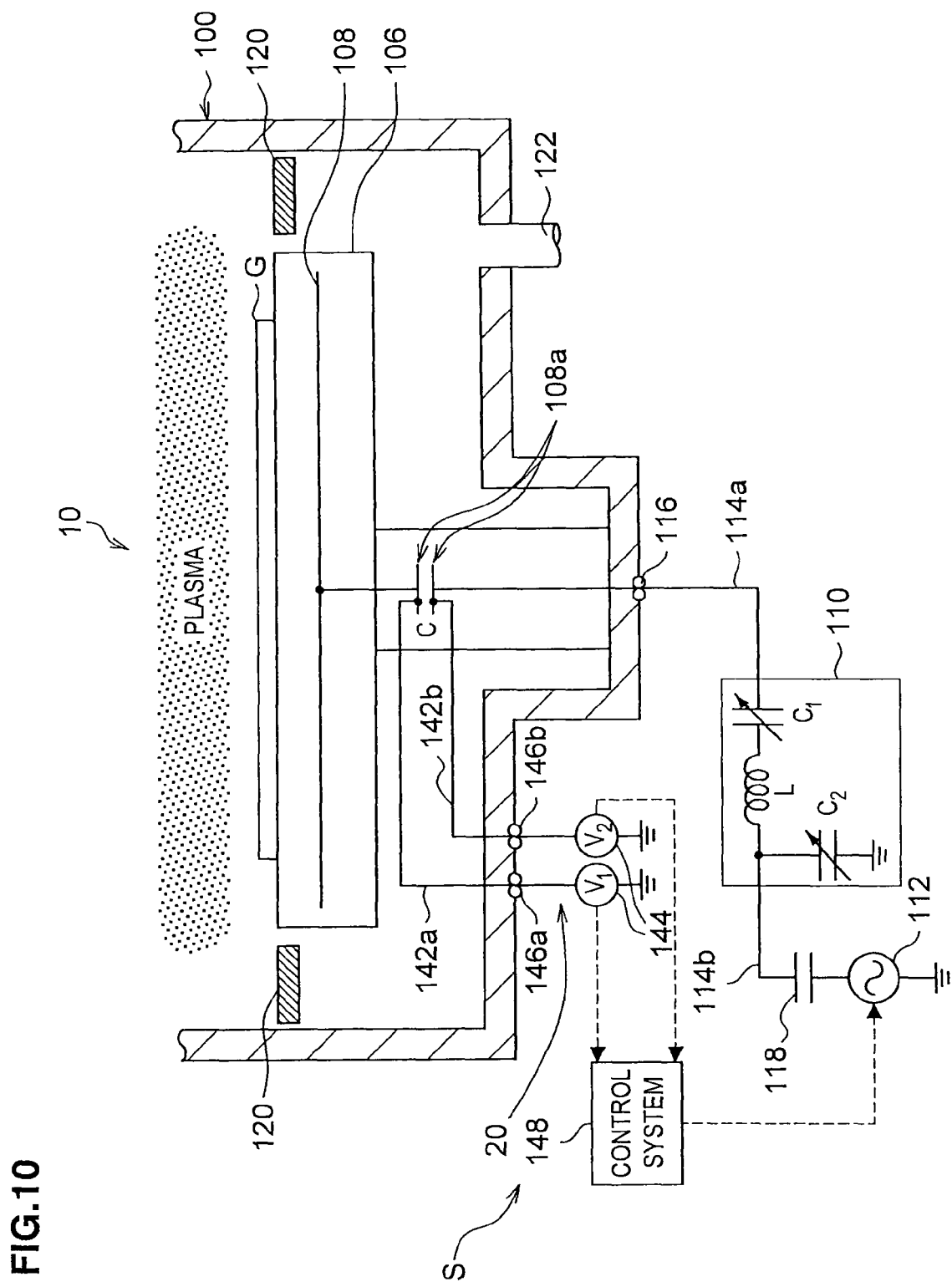
FIG. 10 is a configuration diagram of a measurement system including a microwave plasma processing system according to a second modification.

The third way proposed by the applicants to set the capacitance C of the capacitor 108a to 4.2 times or less than the sheath capacitance $C_{sheath}$ is as follows. With reference to FIG. 10, the capacitor 108a is provided in the power feeding rod 106a below the susceptor 106, the capacitor 108a being connected to the power-supply line 114a.

Also in this method, the voltages $V_1$ and $V_2$ at the pair of plates of the capacitor 108a may be actually measured and the high-frequency electric power P of the susceptor 106 may be computed from the actual measurements, thereby deriving the high-frequency electric power immediately below the substrate, the electric power being available for the plasma control. Note, however, that a power leak from the bottom of the susceptor 106 to the processing chamber 100 may not be detected.

(Third Modification)

Figure 11:
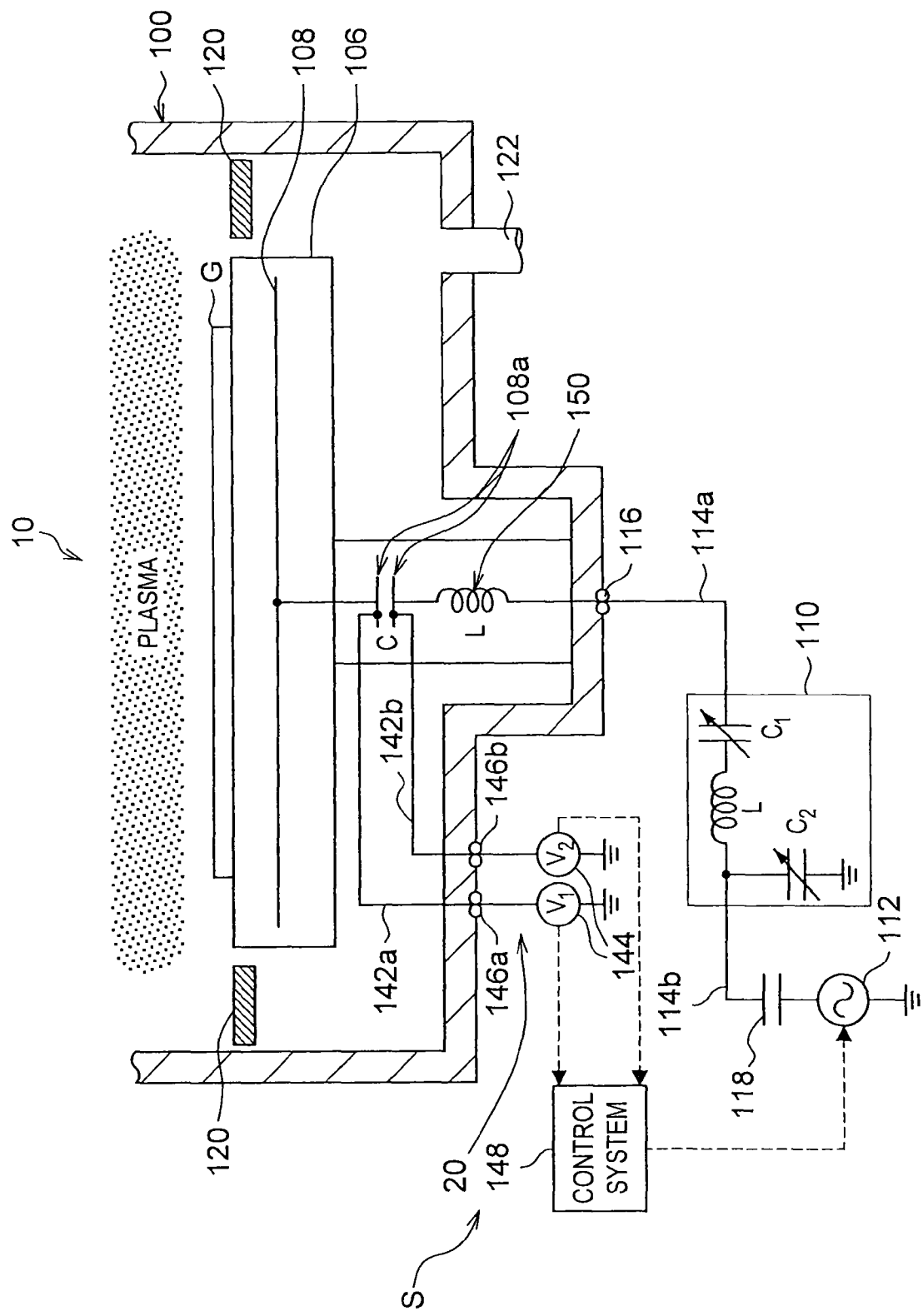
FIG. 11 is a configuration diagram of a measurement system including a microwave plasma processing system according to a third modification.

With reference to FIG. 11, for example, for any of the capacitors 108a shown in FIG. 1, FIG. 9, and FIG. 10, an inductor 150 as a resonance circuit (LC=$1/\omega_0^2$; $\omega_0$ is a resonance frequency) may be connected in series with the capacitor 108a.

The load-impedance increase due to the capacitor 108a may thus be cancelled by the inductor 150 (serial resonance circuit), thereby reducing the impedance of the power-supply line 114a. The load of the matching box 110 may thus also be reduced.

According to the above embodiments and the modifications thereof, the capacitor 108a may be used to accurately measure the power immediately below the substrate.

Although in the above embodiments, the voltages of the electrical signals at the pair of plates of the capacitor 108a are measured as the parameters to control the plasma, the present invention is not limited thereto. At least one of the voltage, the current, and the phase at the pair of plates of the capacitor 108a, or combination thereof may be measured.

For the capacitor area being less than the substrate size, the sheath capacitance $C_{sheath}$ (=ground sheath capacitance $C_2$) may be limited differently.

The control circuit 148d is an example of a control section that uses the parameters measured by the measurement device 20 to compute the high-frequency electric power and uses the computed high-frequency electric power to feedback-control the high-frequency power supply 112. Specifically, the control section may be configured by hardware (one or more circuits) or by software (one or more programs).

The processing unit may process several sizes of the substrate G including the $G_{4.5}$ substrate size of 730 mm×920 mm (the size in the chamber is 1000 mm×1190 mm) and the $G_5$ substrate size of 1100 mm×1300 mm (the size in the chamber is 1470 mm×1590 mm). The target object applied with the desired process is not limited to the above sized substrates G. The target object may be, for example, a silicon wafer of 200 mm or 300 mm diameter.

In the above embodiments, the operation of each section is related to each other. Each operation may thus be replaced with a series of operations in consideration of the relations. Such a replacement may convert the embodiment of a measurement system using a plasma processing system to an embodiment of a measurement method using a plasma processing system.

The preferred embodiments of the present invention have been described with reference to the appended drawings, but it is clearly apparent that the present invention is not limited by the examples. It should be understood by those skilled in the art that various modifications, combinations, sub-combinations and alterations may occur depending on design needs and other factors insofar as they are within the scope of the appended claims or the equivalents thereof.

Figure 12:
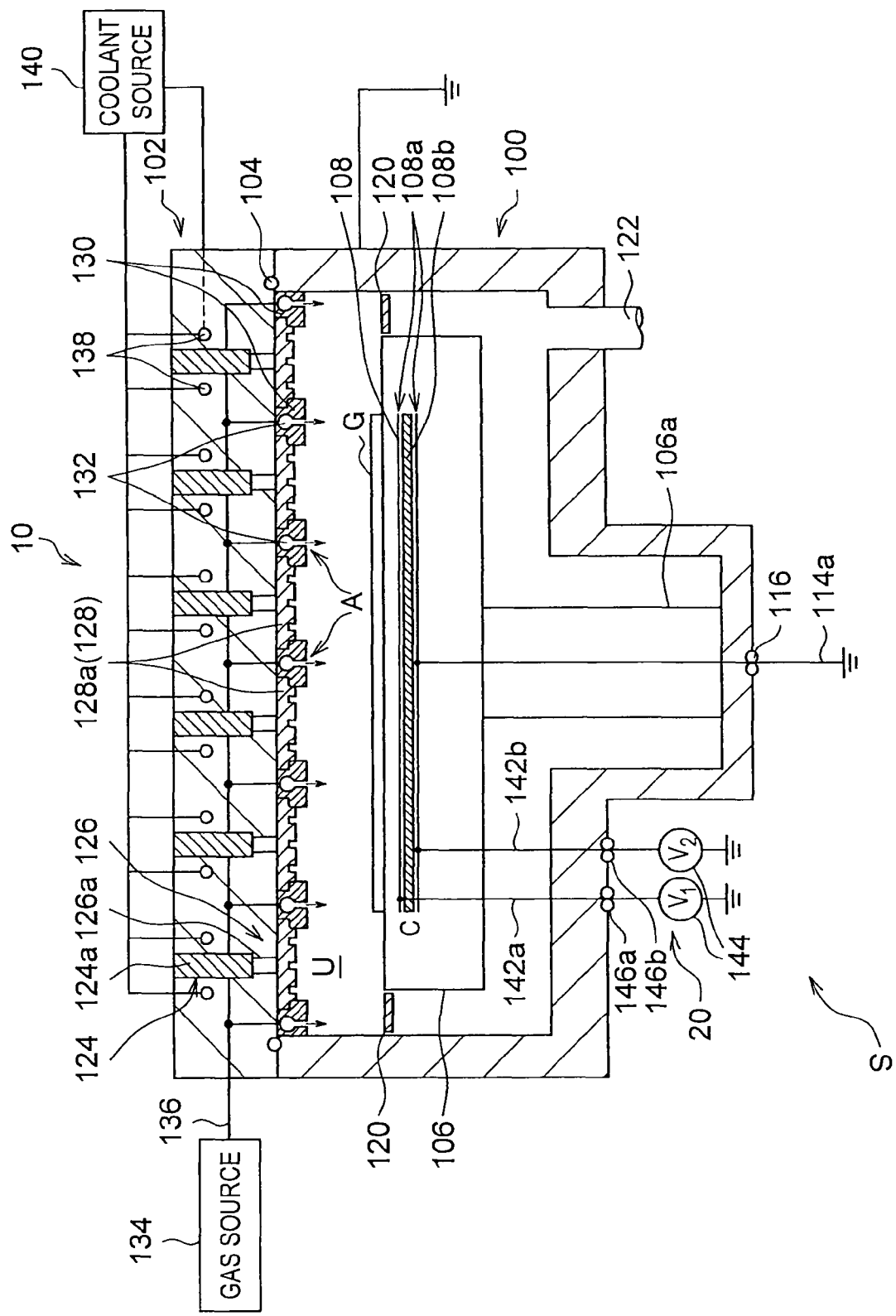
FIG. 12 is a configuration diagram of a measurement system including a modification of a microwave plasma processing system according to one embodiment of the present invention.

For example, the measurement system S according to the present invention may measure the voltage of the cathode electrode (the lower electrode, RI mode) of the microwave plasma processing system 10 shown in FIG. 1 and may also measure the voltage of the anode electrode (upper electrode, RI mode) as the parameter to control the plasma generated in the microwave plasma processing system shown in FIG. 12.

Specifically, the measurement system according to the present invention is not limited to the measurement of the voltage of the electrode in the cathode coupling in which the substrate G is mounted on the high-frequency power supply side as shown in the microwave plasma processing system in FIG. 1. The measurement system may also be applied to the measurement of the voltage of the electrode in the anode coupling in which the substrate G is mounted on the ground electrode side and the plasma is generated using the microwave emitted from the upper portion as shown in the microwave plasma processing system in FIG. 12. In particular, it is important in the anode coupling to measure the voltage of the electrode, because the plasma generated in the upper portion of the processing chamber is lost on the internal side wall of the processing chamber as the plasma is diffused.

The plasma processing system using the dielectric member according to the present invention is not limited to the above microwave plasma processing system having the dielectric window parts. The plasma processing system according to the present invention may also be used in a radial line slot antenna (RLSA) microwave plasma processing system, an inductive coupling plasma (ICP) processing system, a capacitive coupling plasma processing system, and an electron cyclotron resonance (ECR) plasma processing system. The measurement system according to the present invention may thus be used to measure the voltage of the anode electrode or the cathode electrode of the various plasma processing systems.

The plasma processing system according to the present invention may perform any processes such as the etching process, the sputtering process, and the CVD process.

What is claimed is:

1. A plasma processing system comprising:
    a processing chamber in which a desired process is applied to a target object using a plasma;
    a stage on which the target object is disposed in the processing chamber;
    a high-frequency power supply supplying high-frequency electric power to the stage;
    a capacitor provided inside the stage and connected to the high-frequency power supply in series; and
    a measurement device measuring voltages at a pair of plates of the capacitor when the high-frequency electric power is supplied from the high-frequency power supply to the stage,
    wherein, with a sheath capacitance $C_{sheath}$ being a predetermined ground sheath capacitance $C_2$ and a ratio of the predetermined ground sheath capacitance $C_2$ to an electrode-side sheath capacitance $C_1$ of the capacitor being $\psi$, a capacitor capacitance C is determined to allow $1+(\psi \times C_{sheath}^2/\{(1+\psi) \times C_{sheath} \times C\})$ to be equal to or more than an electrode-voltage ratio that provides acceptable error in measurement of high frequency power immediately below the target object.

2. The plasma processing system according to claim 1, wherein the capacitor capacitance C is 4.2 times or less than the sheath capacitance $C_{sheath}$.

3. The plasma processing system according to claim 1, further comprising a power feeding portion provided in the stage, wherein
    the capacitor is a part of the power-feeding portion at a position opposing the target object disposed by the stage.

4. The plasma processing system according to claim 3, wherein the capacitor is a part of the power-feeding portion at an end thereof.

5. The plasma processing system according to claim 3, wherein the high-frequency power supply applies the high-frequency electric power via the power-feeding portion, the system further comprising a matching box provided between and connected to the high-frequency power supply and the power feeding portion, the matching box matching an output impedance of the high-frequency power supply and a load impedance of the power feeding portion.

6. The plasma processing system according to claim 1, further comprising a power feeding portion provided in the stage, wherein the capacitor is a part of the power-feeding portion at a position not opposing the target object disposed by the stage.

7. The plasma processing system according to claim 1, wherein the capacitor capacitance C is formed to be 4.2 times or less than the sheath capacitance $C_{sheath}$ by having a dielectric material of a predetermined dielectric constant between the capacitor's electrodes or having a predetermined electrode area and a predetermined electrode interval.

8. The plasma processing system according to claim 1, further comprising a resonance circuit connected in series to the capacitor.

9. The plasma processing system according to claim 1, wherein the capacitor capacitance C is 2.1 times or less than the sheath capacitance $C_{sheath}$.

10. The plasma processing system according to claim 1, further comprising a control section using voltages at the pair of plates of the capacitor measured by the measurement device to compute the high-frequency electric power, the control section also using the computed high-frequency electric power to feedback control the high-frequency power supply.

11. A measurement system used for a plasma processing system, the plasma processing system comprising:
    a processing chamber in which a desired process is applied to a target object using a plasma;
    a stage on which the target object is disposed in the processing chamber;
    a high-frequency power supply supplying high-frequency electric power to the stage; and
    a capacitor provided inside the stage and connected to the high-frequency power supply in series,
    the measurement system measuring voltages at a pair of plates of the capacitor when the high-frequency electric power is supplied from the high-frequency power supply to the stage,
    wherein, with a sheath capacitance $C_{sheath}$ being a predetermined ground sheath capacitance $C_2$ and a ratio of the predetermined ground sheath capacitance $C_2$ to an electrode-side sheath capacitance $C_1$ of the capacitor being $\psi$, a capacitor capacitance C is determined to allow $1+(\psi \times C_{sheath}^2/\{(1+\psi) \times C_{sheath} \times C\})$ to be equal to or more than a electrode-voltage ratio that provides acceptable error in measurement of high frequency power immediately below the target object.

12. The measurement system according to claim 11, wherein
    the system measures voltages at the pair of plates of the capacitor having a capacitance C of 4.2 times or less than the sheath capacitance $C_{sheath}$.

13. A control system for controlling a plasma using a plasma processing system, the plasma processing system comprising:
    a processing chamber in which a desired process is applied to a target object using a plasma;
    a stage on which the target object is disposed in the processing chamber;
    a high-frequency power supply connected to the stage, the high-frequency power supply supplying high-frequency electric power to the stage,
    a capacitor provided inside the stage and connected to the high-frequency power supply in series;
    a power feeding portion embedded in the stage; and
    the control system comprising:

a measurement device measuring voltages at a pair of plates of the capacitor when the high-frequency electric power is supplied from the high-frequency power supply to the stage; and a control section using voltages at the pair of plates of the capacitor measured by the measurement device to compute the high-frequency electric power, the control section also using the computed high-frequency electric power to feedback control the high-frequency power supply, wherein, with a sheath capacitance $C_{sheath}$ being a redetermined ground sheath capacitance $C_2$ and a ratio of the predetermined ground sheath capacitance $C_2$ to an electrode-side sheath capacitance $C_1$ of the capacitor being $\psi$, a capacitor capacitance $C$ is determined to allow $1+(\psi \times C_{sheath}^2/\{(1+\psi) \times C_{sheath} \times C\})$ to be equal to or more than a electrode-voltage ratio that provides acceptable error in measurement of high frequency power immediately below the target object.

14. The control system according to claim 13, wherein the measurement device measures voltages at the pair of plates of the capacitor having a capacitance $C$ of 4.2 times or less than the sheath capacitance $C_{sheath}$.

* * * * *